United States Patent
Thomas et al.

(12) 
(10) Patent No.: US 6,331,763 B1
(45) Date of Patent: *Dec. 18, 2001

(54) DEVICES AND METHODS FOR PROTECTION OF RECHARGEABLE ELEMENTS

(75) Inventors: Brian Thomas, San Francisco; Jean-Marc Beaufils, Mountain View; Adrian Cogan, Redwood City, all of CA (US); Bernard Dallemange, Osny; Gilles Gozlan, Le Mesnil Theribus, both of (FR); Jiyuan Luan, Fremont, CA (US); Neill Thornton, Turlock, CA (US); James Toth, San Carlos, CA (US)

(73) Assignee: Tyco Electronics Corporation, Middletown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/425,519

(22) Filed: Oct. 22, 1999

Related U.S. Application Data

(63) Continuation-in-part of application No. 09/060,863, filed on Apr. 15, 1998.
(60) Provisional application No. 60/126,952, filed on Mar. 25, 1999.

(51) Int. Cl.[7] ............................ H01M 10/44; H01M 10/46
(52) U.S. Cl. ............................................................ 320/136
(58) Field of Search ................................. 320/127, 134, 320/136, 135, 137

(56) References Cited

U.S. PATENT DOCUMENTS

| | | |
|---|---|---|
| 4,509,102 | 4/1985 | Ayer . |
| 5,150,271 | 9/1992 | Unterweger et al. . |
| 5,177,426 | 1/1993 | Nakanishi et al. . |
| 5,363,030 | 11/1994 | Ford et al. . |
| 5,539,299 | 7/1996 | Fernandez et al. . |
| 5,602,460 | 2/1997 | Fernandez et al. . |
| 5,625,273 | 4/1997 | Fehling et al. . |
| 5,710,505 | 1/1998 | Patino . |
| 5,763,929 | 6/1998 | Iwata . |
| 5,783,322 | 7/1998 | Nagai et al. . |
| 5,789,900 | 8/1998 | Hasegawa et al. . |

FOREIGN PATENT DOCUMENTS

| | | | |
|---|---|---|---|
| 31 48 860 A1 | 6/1983 | (DE) . | |
| 3621200 A1 | 6/1986 | (DE) . | |
| 0 512 340 A1 | 4/1992 | (EP) . | |
| 0 542 365 A1 | 11/1992 | (EP) . | |
| 0 644 642 A2 | 7/1994 | (EP) . | |
| 0 739 049 A1 | 4/1996 | (EP) . | |
| 0 729 185 A2 | 8/1996 | (EP) . | |
| 0 736 950 A1 | 9/1996 | (EP) ............................. H02H/9/04 |
| 0 849 815 A1 | 7/1997 | (EP) . | |
| 2 192 102 | 12/1987 | (GB) . | |
| 62-41343 | 3/1987 | (JP) . | |
| 62-272822 | 11/1987 | (JP) . | |
| 10-98829 | 4/1989 | (JP) . | |
| 7-153367 | 6/1995 | (JP) . | |
| 8 172001 | 7/1996 | (JP) . | |
| 8-172001 | 7/1996 | (JP) . | |
| 9-129818 | 5/1997 | (JP) . | |
| 10-145967 | 5/1998 | (JP) . | |
| WO 94/00888 | 1/1994 | (WO) . | |
| WO 96/08846 | 3/1996 | (WO) . | |
| WO 96/24170 | 8/1996 | (WO) . | |

OTHER PUBLICATIONS

Patent Abstracts of Japan, vol. 13, No. 421 (E–822), Sep. 19, 1989 & JP 01 157234 a (Tokyo Electric), Jun. 20, 1989.
Patent Abstracts of Japan, vol. 14, No 278 (E–0941), Jun. 15, 1990 & JP 02 087935 A (Asahi Chem), Mar. 28, 1990.
Patent Abstracts of Japan, vol. 1999, No. 05, May 31, 1999 & JP 11 054110 A (N II C Mori Energ KK), Feb. 26, 1999 abstract.

*Primary Examiner*—Edward H. Tso
(74) *Attorney, Agent, or Firm*—Lyon & Lyon LLP

(57) ABSTRACT

A protection circuit for use with a charger and a chargeable element, such as a rechargeable lithium ion battery, comprises a shunt regulator having a threshold ON voltage coupled in parallel across the chargeable element, and a temperature-dependent resistor, e.g., a positive temperature coefficient device, coupled in series between the charger and the chargeable element. The temperature dependent resistor is thermally and electrically coupled to the shunt regulator, wherein the first variable resistor limits current flowing through the shunt regulator if the current reaches a predetermined level less than that which would cause failure of the regulator, due to ohmic heating of the regulator.

39 Claims, 26 Drawing Sheets

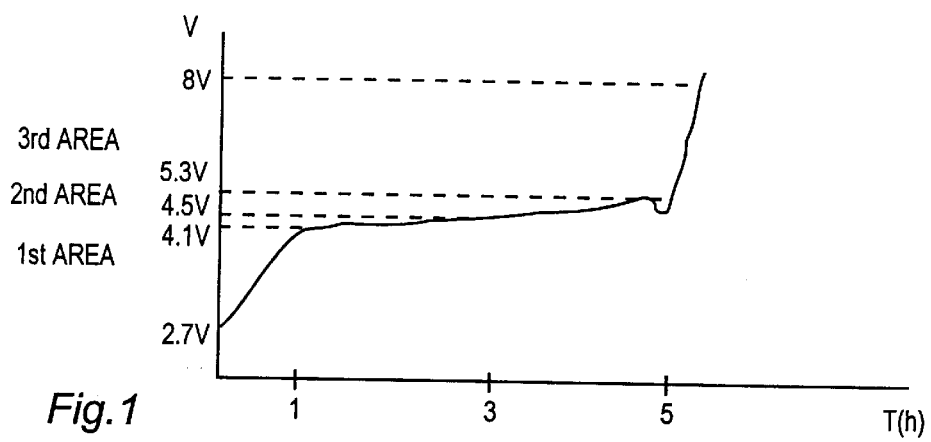
Fig.1
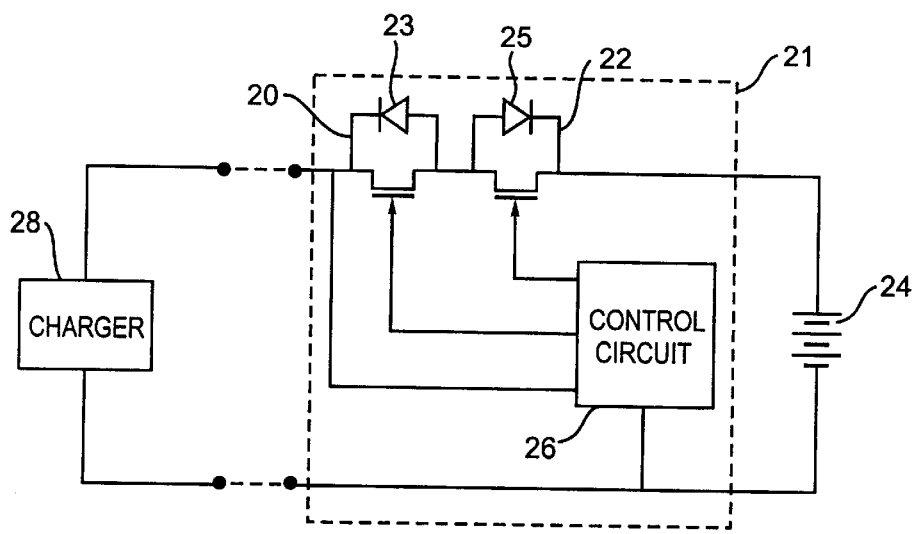
Fig.2
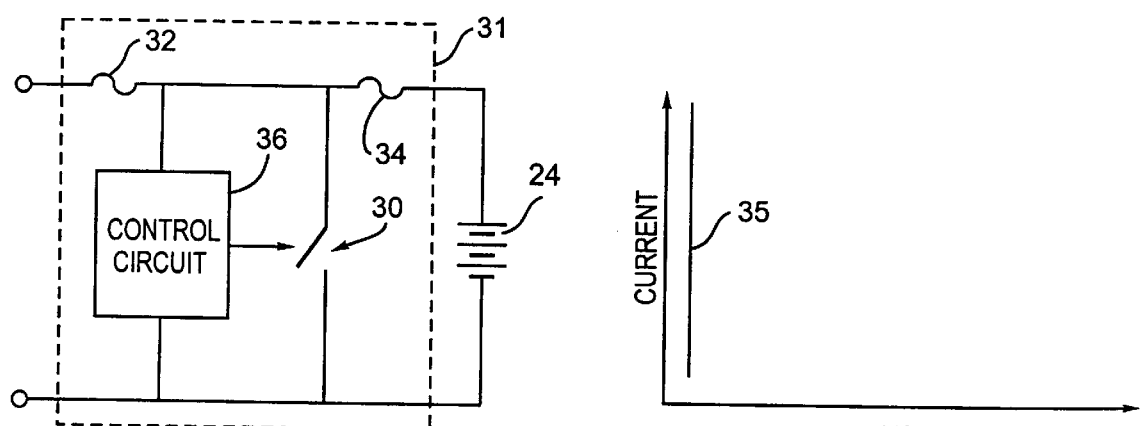
Fig.3A
Fig.3B

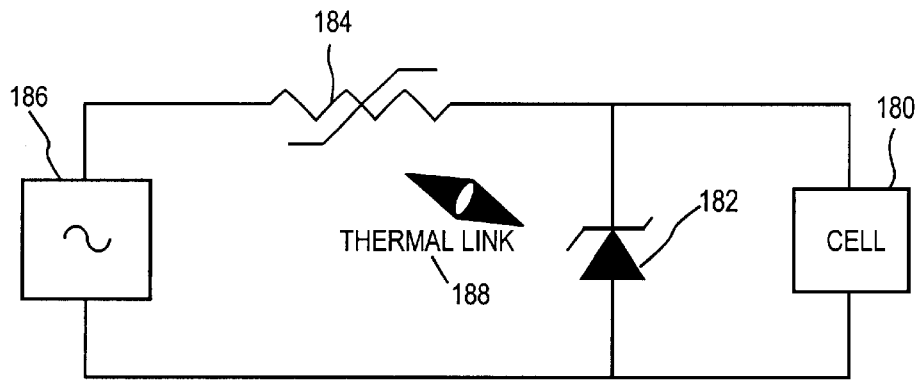
Fig. 31
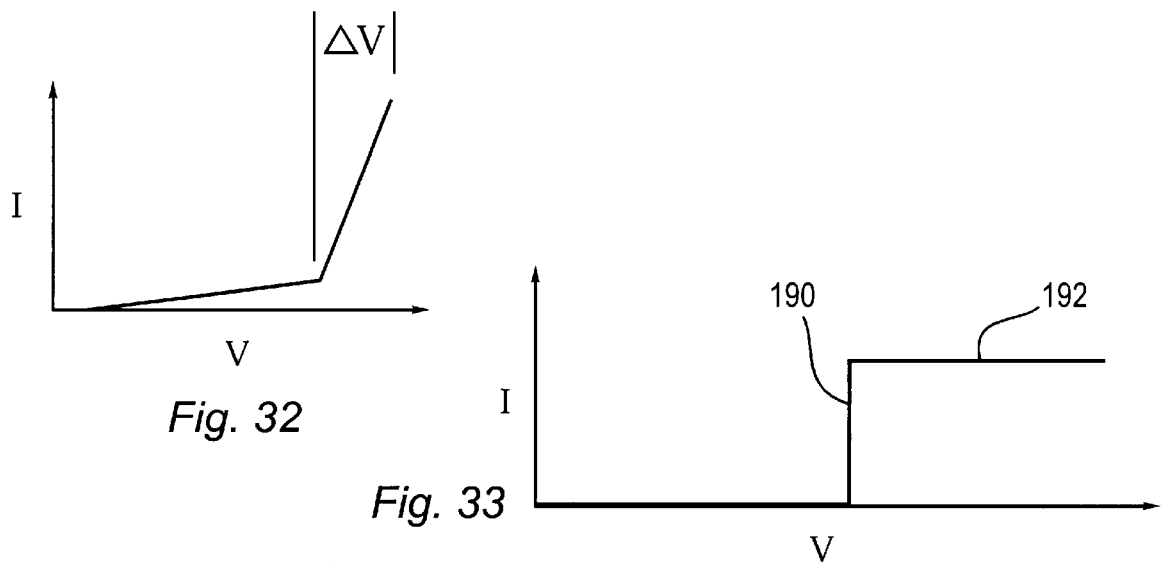
Fig. 32
Fig. 33
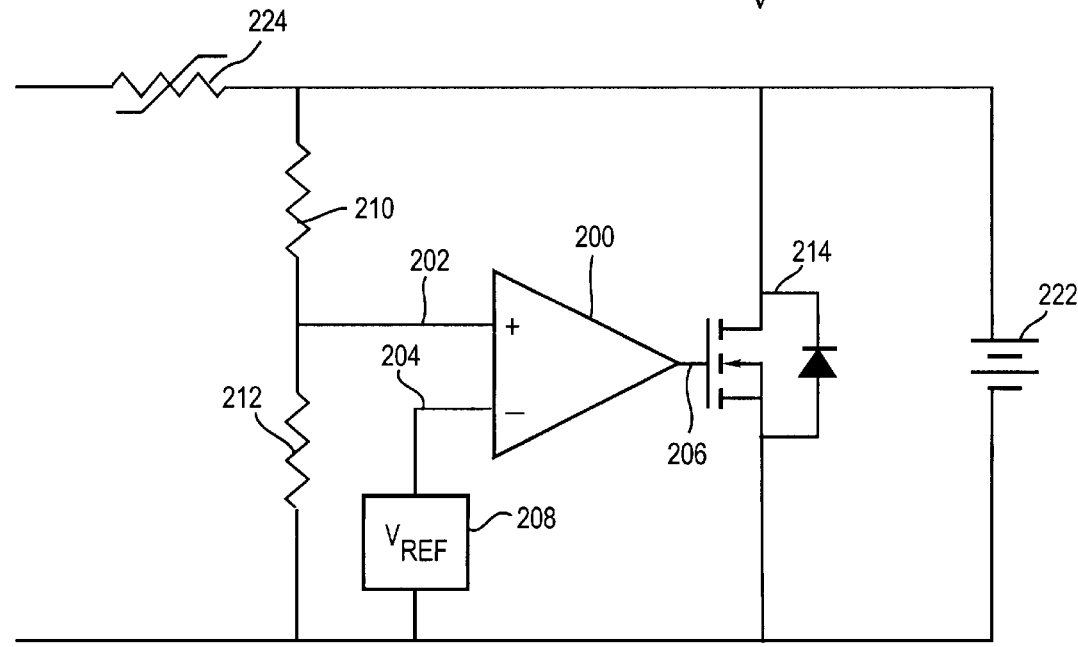
Fig. 34

DEVICES AND METHODS FOR PROTECTION OF RECHARGEABLE ELEMENTS

RELATED APPLICATION DATA

This application is a continuation-in-part of application Ser. No. 09/060,863, filed Apr. 15, 1998, and a continuation-in-part of provisional application Ser. No. 60/126,952, filed on Mar. 25, 1999, which are hereby fully incorporated by reference for all they teach and disclose.

FIELD OF INVENTION

The present inventions pertain generally to the field of overvoltage and overcurrent protection systems and more specifically to devices and methods for protecting rechargeable elements, such as rechargeable batteries, from overvoltage or overcurrent conditions.

BACKGROUND

Electrical circuits that protect rechargeable elements, such as rechargeable battery packs, are well known. However, such rechargeable elements, and in particular rechargeable lithium battery cells, can be dangerous if the operating voltage exceeds a safe limit.

For example, FIG. 1 shows a typical charging curve, i.e., the voltage across the battery vs. time, for a common lithium battery pack (e.g., used for a wireless telephone handset) allowed to keep charging beyond its maximum safe level. As labeled in FIG. 1, this curve may be divided into three general areas.

The first area is represented by the region where the voltage, V, is less han 4.5 volts. In this area, the battery charges at a safe level, with the temperature of the battery remaining below 60° C. to 70° C., and the pressure inside the battery remaining below 3 bars.

The second area is represented by the region where the voltage is between 4.5 volts and 5.3 volts. When charging is in this area, the battery begins to operate in a dangerous mode, with the temperature rising above 70° C., and the pressure inside the battery rising to a range between 3 bars to 10 bars. Even at this slightly increased voltage level, the battery might even explode.

The third area is represented by the region where the voltage exceeds 5.3 volts. At this stage, it is too late to save the battery, which is subjected to internal degradation and may explode or combust. Notably, battery cells in a "fully-charged" state are more dangerous and susceptible to explosions than those in the discharged state.

In particular, in order to be sure that a lithium battery operates in its safe operating mode during a charging operation, at least one of the following three conditions must be met: 1) temperature <60° C., 2) pressure <3 bars, or 3) voltage <4.5 volts.

Towards this end, rechargeable lithium ion battery packs are conventionally provided with a "smart" electronic circuit in series with the batteries to provide protection against exposure to an excessive voltage or current. Such smart protection circuits may also guard against an undervoltage condition caused by overdischarge of the battery pack.

By way of example, a conventional "smart" protection circuit 21 for a rechargeable lithium ion battery pack is shown in FIG. 2. In particular, first and second MOSFET switches 20 and 22 are placed in series with one or more battery cells 24. The MOSFET switches 20 and 22 are switched ON or OFF by control circuitry 26, which monitors the voltage and current across the battery cell(s) 24. In normal operation, the MOSFET switches 20 and 22 are switched "ON" by the control circuitry 26 to allow current to pass through in either direction for charging or discharging of the battery cell(s) 24. However, if either the voltage or current across the battery cell(s) 24 exceeds a respective threshold level, the control circuitry 26 switches OFF the MOSFETs 20 and 22, thereby opening the circuit 21. The control circuitry 26 also monitors the voltage and current levels across a charging source 28 to determine when it is safe to switch back ON the respective MOSFETs 20 and 22.

As will be appreciated by those skilled in the art, the smart protection circuit 21 is relatively complex and expensive to implement with respect to the overall expense of a conventional battery pack. Further, the series resistance across the MOSFETs 20 and 22 is relatively high, thereby decreasing the efficiency of both the charging source 28 and the battery cells 24. Notably, both MOSFETs 20 and 22 are needed to prevent current from passing in either direction when the circuit is open,—i.e., by way of respective body diodes 23 and 25 biased in opposite directions—, which increases the complexity, cost and total in-series resistance of the protection circuit 21. Also, because the MOSFETS 20 and 22 are subject to failure if exposed to a sudden high voltage (or use of an improper high voltage charger), secondary protection of the battery cell(s) 24 is still needed, such as, e.g., a positive temperature coefficient ("PTC") resettable fuse employed in series with each cell.

By way of background information, devices exhibiting a positive temperature coefficient of resistance effect are well known and may be based on ceramic materials, e.g., barium titanate, or conductive polymer compositions. Such conductive polymer compositions comprise a polymeric component and, dispersed therein, a particulate conductive filler. At low temperatures, the composition has a relatively low resistivity. However, when the composition is exposed to a high temperature due, for example, to ohmic heating from a high current condition, the resistivity of the composition increases, or "switches," often by several orders of magnitude. The temperature at which this transition from low resistivity to high resistivity occurs is called the switching temperature, Ts. When the device cools back below its switching temperature Ts, it returns to a low resistivity state. Thus, when used as an in-series current limiter, a PTC device is referred to as being "resettable," in that it "trips" to high resistivity when heated to its switching temperature , Ts, thereby decreasing current flow through the circuit, and then automatically "resets" to low resistivity when it cools back below Ts, thereby restoring full current flow through the circuit after an overcurrent condition has subsided.

In this application, the term "PTC" is used to mean a composition which has an R14 value of at least 2.5 and/or an R100 value of at least 10, and it is preferred that the composition should have an R30 value of at least 6, where R14 is the ratio of the resistivities at the end and the beginning of a 14° C. range, R100 is the ratio of the resistivities at the end and the beginning of a 100° C. range, and R30 is the ratio of the resistivities at the end and the beginning of a 30° C. range. Generally the compositions used in devices of the present inventions show increases in resistivity, which are much greater than those minimum values.

Suitable conductive polymer compositions are disclosed in U.S. Pat. Nos. 4,237,441 (van Konynenburg et al), 4,545,926 (Fouts et al), 4,724,417 (Au et al), 4,774,024 (Deep et al), 4,935,156 (van Konynenburg et al), 5,049,850

(Evans et al), 5,250,228 (Baigrie et al), 5,378,407 (Chandler et al), 5,451,919 (Chu et al), 5,582,770 (Chu et al), 5,701,285 (Chandler et al), and 5,747,147 (Wartenberg et al), and 6,130,597 (Toth et al). The disclosure of each of these patents is incorporated herein by reference for all that it discloses.

Referring to FIG. 3A, a crowbar type protection circuit 31 is also well known. In particular, a switch element 30 is placed in parallel across the battery cell(s) 24. The switch 30 is opened or closed by control circuitry 36, which monitors the voltage and current across the battery cell(s) 24. In normal operation, the switch 30 is left open. However, if either the voltage or current across the battery cell(s) 24 exceeds a respective threshold, the control circuitry 36 closes the switch 30, thereby shorting the circuit across the battery cell(s) 24.

FIG. 3B illustrates the current versus voltage curve 35 through the switch element 30, when it is closed. Notably, the current can quickly reach relatively high levels, depending on the characteristics and duration of a particular power surge. Towards this end, a first overcurrent element 32 may be provided between the switch element 30 and the charging element 28 to help protect the switch element 30 from continuous current from the charging element 28 (shown in FIG. 2). Similarly, a second overcurrent element 34 may be provided between the switch element 30 and the battery cell(s) 24, in order to protect the cell(s) 24. However, the combined in-series resistance of the overcurrent elements 32 and 34 is undesirable across the battery path.

FIG. 4A depicts an alternate overvoltage protection clamping circuit 41. In particular, a voltage clamping element 40, such as a zener diode, is used in place of the switch element 30 in parallel with the battery cell(s) 24. In an overvoltage condition, the clamping element 40 limits the voltage across the battery cell(s) 24.

FIG. 4B illustrates the current versus voltage curve 45 for the clamping circuit 41. As with the crowbar circuit 31, current through the clamp 40 can quickly reach relatively high levels, depending on the characteristics and duration of a particular voltage spike. Again, placement of current limiting elements (not shown in FIG. 4) can protect the clamp 40 and/or battery cell(s) 24 from excessive current. Notably, the clamping element 40 can have a relatively high current leakage, e.g., as in the case of a zener diode, causing the battery cell(s) 24 to lose their charge quickly over time.

SUMMARY OF THE INVENTIONS

In accordance with one aspect of the inventions disclosed herein, a protection circuit for use with a charger and a chargeable element includes a shunt regulator having first and second terminals for coupling in parallel across the chargeable element, the shunt regulator having a threshold ON voltage. A temperature dependent resistor is thermally and electrically coupled to the shunt regulator, the resistor having a first terminal for coupling to the charger in series and a second terminal for coupling to the chargeable element in series.

In a preferred embodiment, the resistor is a positive temperature coefficient device, which switches from a relatively low resistance to a relatively high resistance when heated to a certain transition temperature. The transition temperature of the device is selected such that current flowing though the shunt regulator in an overvoltage condition causes sufficient ohmic heat generation in the shunt regulator to heat the device to the transition temperature prior to failure of the shunt regulator.

In accordance with another aspect of the inventions disclosed herein, control circuitry for controlling a shunt regulator transistor switch in a protection circuit for use with a charger and a chargeable element includes first and second voltage detection circuits. The first voltage detection circuit is relatively low leakage and is configured to activate the second voltage detection circuit if the voltage across the chargeable element approaches a threshold ON voltage of the transistor switch. The second voltage detection circuit is relatively precise and is configured to activate the transistor switch if the voltage across the chargeable element reaches the threshold ON voltage.

In accordance with yet another aspect of the inventions disclosed herein, control circuitry for controlling a shunt regulator transistor switch in a protection circuit for use with a charger and a chargeable element includes an operational amplifier having an output coupled to an activation gate of the transistor switch, and a voltage clamping element coupled to the operational amplifier output, the clamping element effectively clamping the activation gate voltage.

In accordance with still another aspect of the inventions disclosed herein, a shunt regulator for protecting a chargeable element from overcharging includes a transistor switch having a thermally-compensated voltage characteristic.

In accordance with yet another aspect of the inventions disclosed herein, a protection circuit for use with a charger and a chargeable element includes an overvoltage shunt regulator having first and second terminals for coupling in parallel across the chargeable element, and an undervoltage protection circuit having first and second configured for coupling in series between the charger and the chargeable element In a preferred embodiment, the overvoltage shunt regulator comprises a first transistor switch having a threshold ON voltage approximating a selected maximum operating voltage of the chargeable element. The undervoltage protection circuit comprises a second transistor switch having a threshold ON voltage approximating a selected minimum operating voltage of the chargeable element.

In accordance with a still further aspect of the inventions disclosed herein, a protection circuit for use with a charger and a chargeable element includes an overvoltage shunt regulator having first and second terminals for coupling in parallel across the chargeable element, the shunt regulator comprising a MOSFET switch having a threshold ON voltage approximating a selected maximum operating voltage of the chargeable element, and a relatively high resistance, reverse-current body diode.

In accordance with a still further aspect of the inventions disclosed herein, a protection circuit for use with a charger and a chargeable element includes an overvoltage shunt regulator having first and second terminals for coupling in parallel across the chargeable element, the shunt regulator comprising a transistor switch having a channel through which current may flow in a forward direction if positive-biased, or a reverse direction if negative-biased. In particular, the transistor switch is constructed such that current flowing in the forward direction encounters relatively low resistance, and current flowing in the reverse direction encounters relatively high resistance.

In accordance with yet another aspect of the inventions disclosed herein, a protection circuit for use with a charger and a chargeable element includes a shunt regulator having first and second terminals for coupling in parallel across the chargeable element, the shunt regulator having a threshold ON voltage. A first positive temperature coefficient (PTC) device is thermally and electrically coupled to the shunt regulator, the first PTC device having a first terminal for coupling to the charger in series and a second terminal for coupling to the chargeable element in series. A second PTC device is coupled in series with the shunt regulator, wherein the transition temperature of the first PTC device is lower than that of the second PTC device.

In accordance with yet another aspect of the inventions disclosed herein, a protection circuit is provided in combination with a battery having a positive terminal and a negative terminal, the protection circuit including a transistor switch coupled in series with the battery, such that, when the transistor switch is ON, the battery will discharge through a load. A temperature-dependent resistor is thermally coupled to the transistor switch, the temperature-dependent resistor having a first terminal coupled to the positive battery terminal. A fixed resistor is provided having a first terminal coupled to a second terminal of the temperature dependent resistor, and a second terminal coupled to the negative battery terminal, such that the respective temperature dependent resistor and fixed resistor are coupled in series with each other and in parallel with the battery. The transistor switch has an activation gate coupled in a divider configuration to the second terminal of the temperature dependent resistor and first terminal of the fixed resistor.

In a preferred embodiment, the temperature dependent resistor switches from a relatively low resistance to a relatively high resistance at a transition temperature selected such that, in an overvoltage condition in the battery, current flowing through the transistor switch will generate sufficient ohmic heat to heat the temperature dependent resistor to the transition temperature before causing failure of the transistor switch.

As will be apparent to those skilled in the art, other and firther aspects and advantages of the present invention will appear hereinafter.

BRIEF DESCRIPTION OF THE DRAWINGS

Preferred embodiments of the present inventions taught herein are illustrated by way of example, and not by way of limitation, in the figures of the accompanying drawings, in which similar elements in the different embodiments are referred to by the same reference numbers for ease in illustratin, and in which:

FIG. 1 shows a charging curve of a typical rechargeable lithium battery;

FIG. 2 is a schematic illustration of a "smart" overvoltage protection circuit employing a pair of transistor elements in series with a rechargeable battery pack;

FIG. 3A is a schematic illustration of a "crowbar" protection circuit employing a voltage controlled short circuit switch in parallel with a rechargeable battery pack;

FIG. 3B depicts the current vs. voltage relationship of the crowbar circuit of FIG. 3A;

FIG. 31 is a simplified schematic of a further preferred overvoltage protection circuit;

FIGS. 32–33 depict the current-voltage relationship of the circuit of FIG. 31;

FIG. 34 is a simplified schematic of a still further preferred overvoltage protection circuit;

DETAILED DESCRIPTION OF THE PREFERRED EMBODIMENTS

In accordance with a first aspect of the present inventions disclosed herein, a protection system is provided which protects, during a charging operation, a rechargeable battery against being overcharged into a dangerous operating mode. The protection system of the embodiments of FIGS. 5–10 may be used as a back up system and will generally be used in conjunction with a smart power circuit that monitors the charge of the battery. Typically, this protection system could be incorporated into the battery itself, or it could be used as part of the pack electronics, or as part of the charger.

Figure 5:
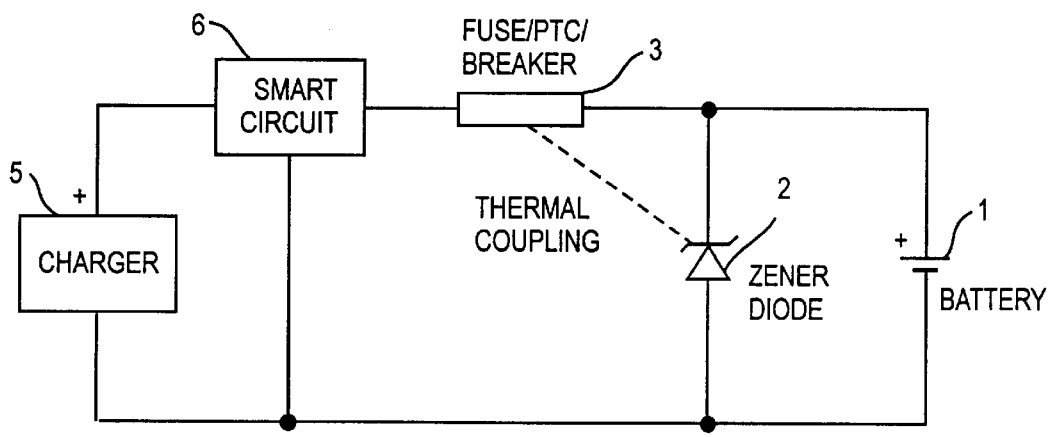
FIGS. 5–10 are simplified block diagrams and circuit schematics of preferred secondary protection circuits, according to one aspect of the present inventions.
Figure 6:
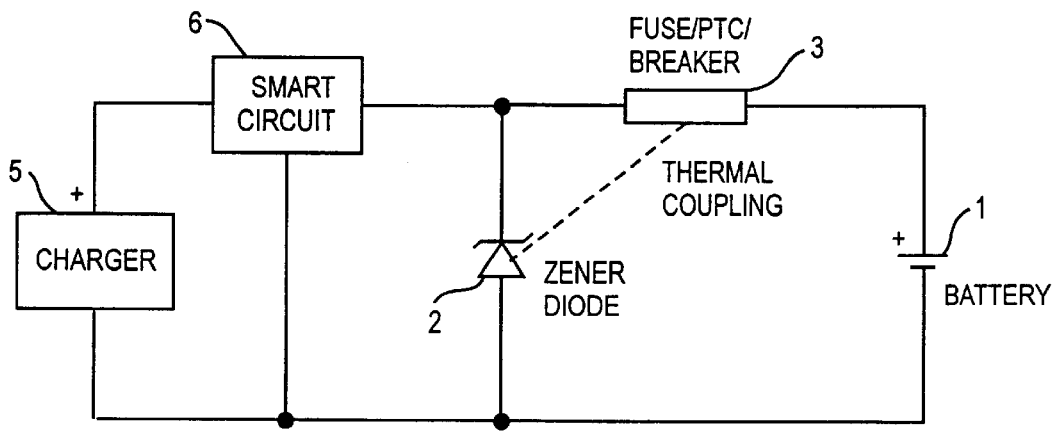
Figure 7:
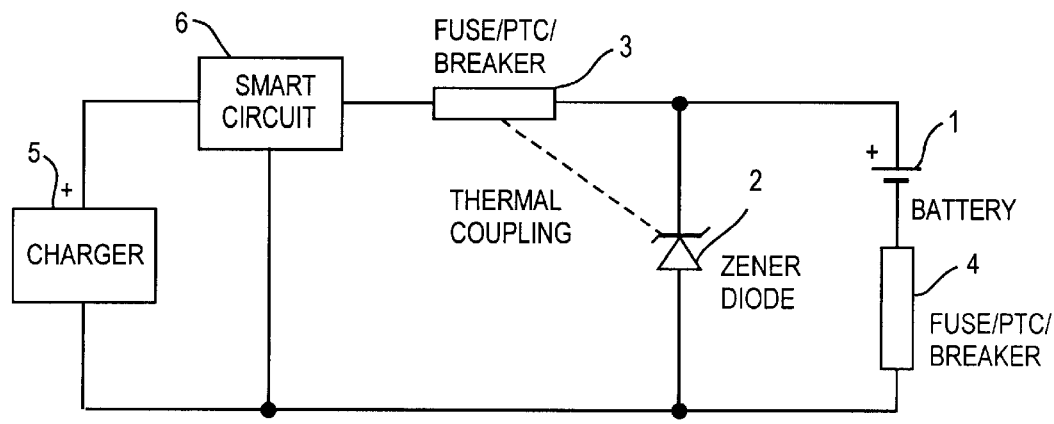

FIGS. 5–7 show the basic circuit embodiments according to this aspect of the present inventions. In FIG. 5, a rechargeable battery 1, such as, e.g., a lithium battery with a maximum operating voltage of 4.5 volts is coupled, in parallel, to a voltage-dependent resistive element, such as a 4.1 volt zener diode 2, forming a parallel circuit. The parallel circuit is coupled in series with a protection element 3, such as a PTC device, a thermal fuse or a bimetallic breaker. Protection element 3 is preferably thermally coupled to zener diode 2 in order to accelerate the activation of the protection element 3. A parallel circuit of a charger 5 and a smart circuit 6 are connected in series with the parallel combination of battery I and zener diode 2. Charger 5 is also connected to a power source (not shown). In this embodiment, since protection element 3 is connected in series with the parallel circuit of battery 1 and zener diode 2, the total amount of fault current flows in protection element 3 and therefore the protection element will be activated faster.

FIGS. 6 and 7 show variations of the embodiment of FIG. 5, including use of an additional protection element 4.

In the above embodiments, since power dissipation in the zener diode 2 is a large value between 1 to 4 watts, the power dissipation can cause an efficient, thermally-assisted tripping of the protection element 3. The protection element 3 and the zener diode 2 may be hybridized to improve the thermal coupling.

When a constant current DC charger 5 (which is generally the case) is used, the current begins to charge battery I because of its low internal resistance. If the smart circuit fails to operate, as soon as the battery voltage reaches 4.3 volts, a small current is diverted into zener diode 2, which maintains the voltage at 4.3 volts. If the charge current becomes higher, the differential resistance of the zener diode 2 will decrease by accepting more and more current to maintain a 4.3 volt constant voltage over the battery 1. In this case, the zener diode 2 is in runaway mode and the zener diode is heated up. The heat dissipated by the zener diode makes the protection element trip faster, thus avoiding overcharging the battery 1 into a dangerous operating mode.

When a constant voltage charger is used as power source 5, the circuits in FIGS. 5–7 operate in a similar manner as the above.

Figure 8:
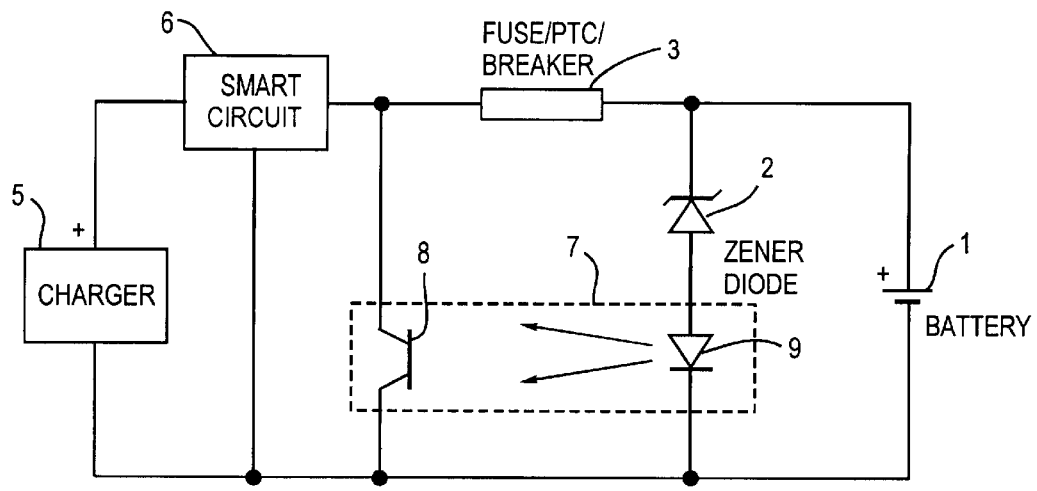

FIG. 8 shows another embodiment of the invention in which an opto-coupler 7 is used. Opto-coupler 7 includes a receiving element, such as a phototransistor 8 and a transmitting element, such as an LED (light-emitting diode) 9. As shown in FIG. 8, rechargeable battery 1 is coupled, in parallel, to the series combination of zener diode 2 with a 3-volt rating, for example, and LED 7 to form a first parallel circuit. A protection element 3, such as a fuse, a PTC device or a bimetallic breaker, is coupled in series with the first parallel circuit. Phototransistor 8 is coupled in parallel with the combination of protection element 3 and the first parallel circuit to form a second parallel circuit. The parallel circuit of a charger 5 and a smart circuit 6 is coupled in parallel with the second parallel circuit. Charger 5 is also connected to a power source (not shown).

The embodiment of FIG. 8 operates according to principles similar to those described above. Under normal conditions, the current in the zener diode 2 is not sufficient to light LED 9. However, if a fault occurs, e.g., a high voltage charger is used, the current in zener diode 2 will increase and thus activate opto-coupler 7, which in turn shunts battery 1. This causes protection element 3 to activate to thereby disconnect battery 1.

Figure 9:
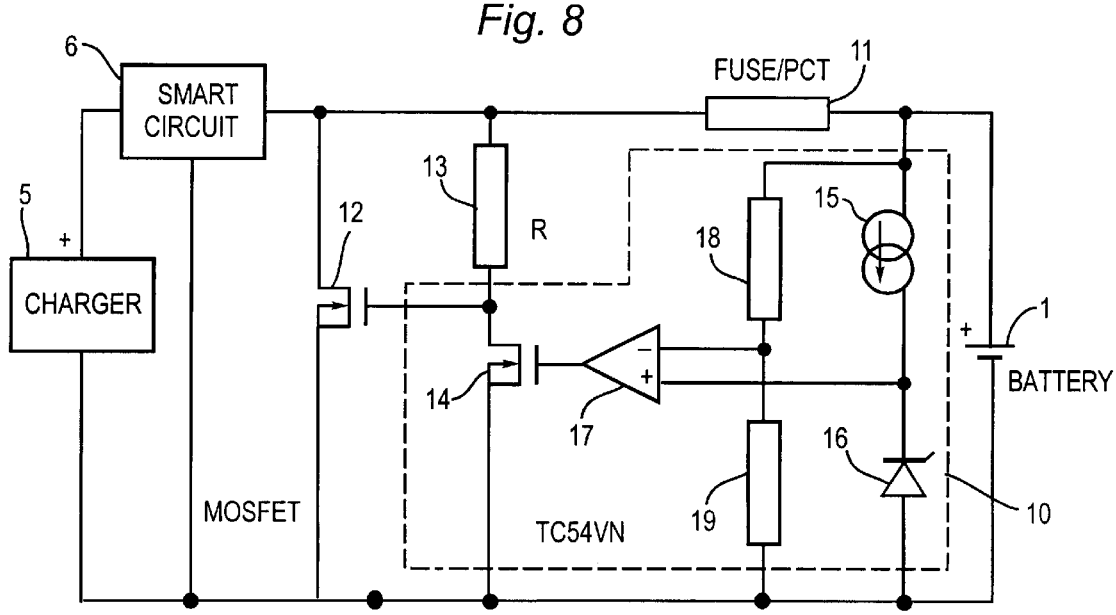

FIG. 9 shows yet another preferred protection circuit. In this embodiment, rechargeable battery 1 is coupled in parallel with an overcharge detection device 10, such as an overvoltage detection device, Model No. TC54VN, (e.g., packages SOT 23B-3 or SOT89-3), manufactured by Telcom Semiconductor, Inc. The parallel circuit of battery 1 and detection device 10 is coupled in series with a protection element 11, which may be a fuse, a thermal fuse or a PTC device. The combination of battery 1, detection device 10 and protection element 11 is coupled in parallel with a power MOSFET transistor 12, such as Motorola MTD 3055EL (VL), case 369A-10. The parallel circuit of a smart circuit 6 and a charger 5 is coupled to battery I in parallel. Charger 5 is also connected to a power source (not shown).

MOSFET 12 is biased by a resistor 13 and driven by detection device 10 via transistor 14. Detection device 10 includes a constant current generator 15, which supplies current to a reference zener diode 16. The voltage of zener diode 16 is compared with the battery voltage using an operational amplifier 17, connected to resistors 18 and 19, as a comparator. When the battery voltage reaches 4.5 volts, comparator 17 outputs a positive voltage which turns off transistor 14, which then turns on MOSFET 12. This causes battery I to be shunted. Thus, a high current flows in protection element 11. If a fuse (such as the AVX-Kyocera by Farnell) is used as protection element 11, it will blow and disconnect battery 1, thus preventing the battery from exploding. If a PTC device is used as protection element 11 instead of a fuse, the PTC will trip and reduce the high current to a low leakage current, thus preventing the battery from exploding.

Under normal conditions, when smart circuit 6 functions properly, the battery voltage is below the voltage of zener diode 16. Thus, comparator 17 outputs a negative voltage which turns on transistor 14, which causes power MOSFET 12 to be in its off state.

In the embodiment of FIG. 9, a constant current charger may be used without danger. Assuming the maximum charge current of battery 1 is 2 C where C is the battery capacity specified by the manufacturer, if the charge current exceeds 2 C, the fuse will blow and disconnect battery 1 from charger 5. However, if the charge current is within 2 C but the charge voltage is higher than 4.5 volts, detection device 10 will detect the fault and shunt battery 1, causing the fuse to blow.

A constant voltage charger may also be used without danger in the embodiment of FIG. 9. If the voltage of charger 5 is too high and a charge current higher than 2 C is induced, the fuse will blow and prevent the battery from exploding. On the other hand, if the charge current is less 2 C but the voltage across the battery is greater than 4.5 volts because of the high voltage of charger 5, then overvoltage detection device 10 will play its role by shunting the battery and blowing the fuse. If a PTC device is used in place of the fuse, the PTC device will trip, thus protecting the battery.

In the embodiment of FIG. 9, all the components (i.e., the protection element, overcharge detection device, resistor and power MOSFET) are preferably surface mounted devices (SMD).

Figure 10:
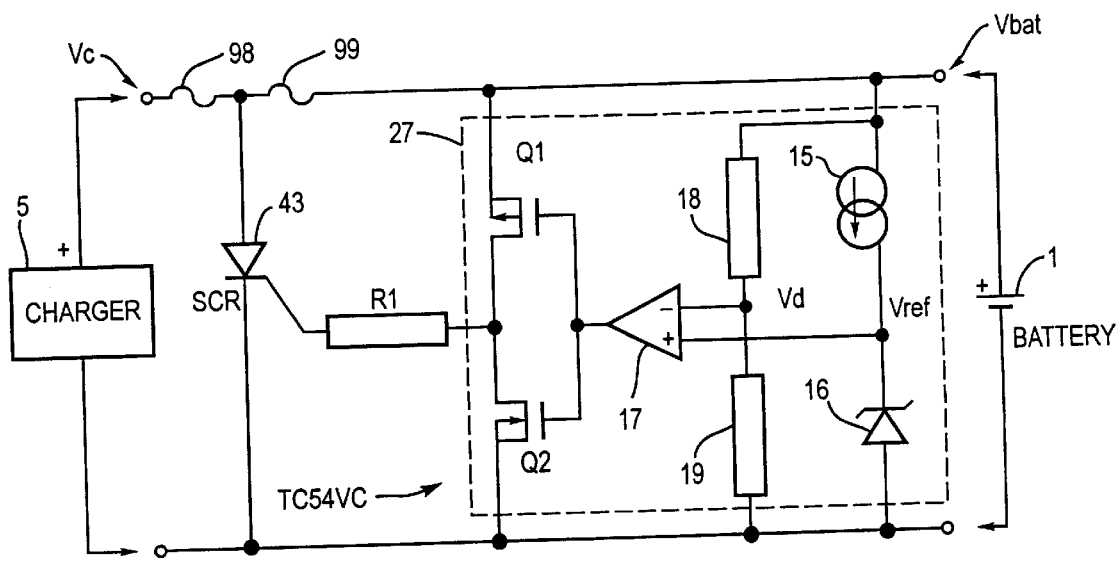

Referring to FIG. 10, in a still further preferred embodiment, a rechargeable battery 1, such as a lithium ion battery, is coupled in parallel with an alternate overcharge detection device 27, such as Model No. TC54VC, by Telcom Semiconductor, Inc. The detection device 27 includes a constant current generator 15, a zener diode 16, resistors 18 and 19, operational amplifier 17, a p-type field effect transistor (FET) QI, and an n-type FET Q2. The parallel circuit of battery 1 and detection device 27 is coupled in series with a first protection element 99. An output of detection device 27 provides control over a thyristor (SCR) 43 via a resistor RI. A second protection element 98 is connected in series with the parallel circuit of the first protection element 99, thyristor 43, detection device 27 and battery 1. A charger 5 is to be connected to the overall circuit. The charger 5 is also connected to a power source (not shown). In a preferred embodiment, each of the two protection elements 99 and 98 may be a fuse with a delay feature, such as a SMD Slo-Blo fuse 2A, commercially available from Littelfuse.

Such a fuse typically has a delay of approximately twenty ms upon occurrence of a high current before it blows. If the high current disappears within this time duration, the fuse will not blow. Also, R1 may be a SMD resistor with a resistance value of 22 k$\Omega$. An example of thyristor 43 may be a ST 1220-600B thyristor, commercially available from ST Microelectronics (France). Under normal conditions, the charger 5 provides a regulated voltage of 4.3 V and supplies a current of two amps via protection elements 99 and 98 to battery 1. A detected voltage Vd is compared with a reference voltage, Vref, using the operational amplifier 17 as a comparator. In this case, the detected voltage Vd is below the reference voltage Vref. Thus, comparator 17 outputs a positive voltage, which will turn on transistor Q2, while transistor QI remains off. Since there is no current flowing through resistor RI, the thyristor 43 is not activated, and a normal charging operation is performed.

In the case in which a wrong charger is used, i.e., a charger with a high voltage rating, such as, e.g., a 12 V charger, the battery voltage Vbat will exceed 4.3 V after Vd exceeds Vref. In such case, the comparator 17 outputs a negative voltage, which turns on transistor Q1, while transistor Q2 is off. This causes a current to flow through resistor RI and to the gate of thyristor 43. Thus, the thyristor 43 is activated and shorts the battery 1 and the charger 5. As a result, a high current is drawn from the battery I and the charger 5, through tyristor 43, to ground. The high current causes protection elements 99 and 98 to blow, thus disconnecting the (wrong) charger 5 from the battery 1. The delay feature of protection elements 99 and 98 advantageously prevents accidental shorting of the battery that lasts for only a very short period of time.

Notably, preferred embodiments of linther inventions and inventive aspects disclosed and described herein are directed primarily to stand alone protection or regulator circuits,— i.e., they are not intended as secondary back-up to a smart circuit, as was the case with the above described preferred embodiments of FIGS. 5–10.

Figure 11:
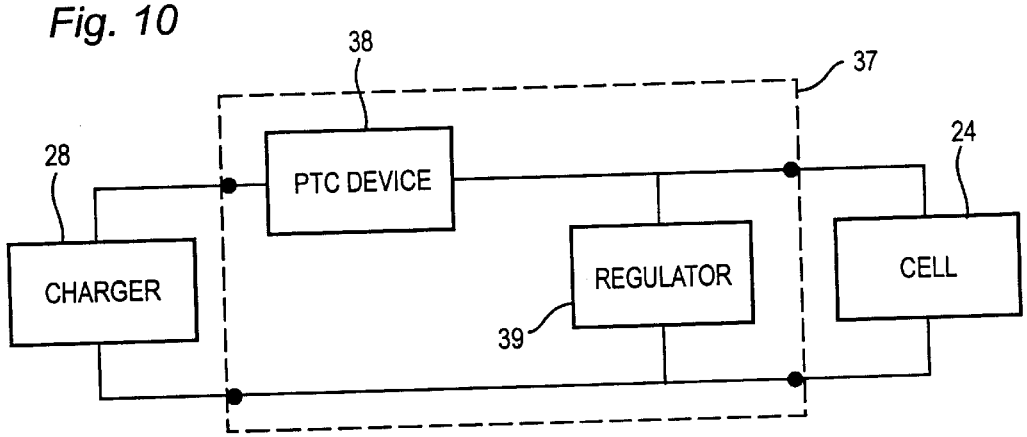
FIG. 11 is a simplified block diagram of a further preferred overvoltage, overcurrent primary protection circuit in accordance with another aspect of the present inventions, including a PTC device in series, and a voltage regulator in parallel, respectively, with a rechargeable battery pack.

For ease in illustration of further inventions and inventive aspects disclosed and described herein, the basic elements of a preferred overvoltage, overcurrent protection circuit 37 are depicted in FIG. 11. In particular, a voltage regulator (e.g., a voltage controlled MOSFET switch) 39 is placed in parallel with the battery cell(s) 24. A PTC device 38 is provided between the regulator 39 and the charging element 28, wherein the PTC device 38 is in series with the battery cell(s) 24.

Figures 12, 13:
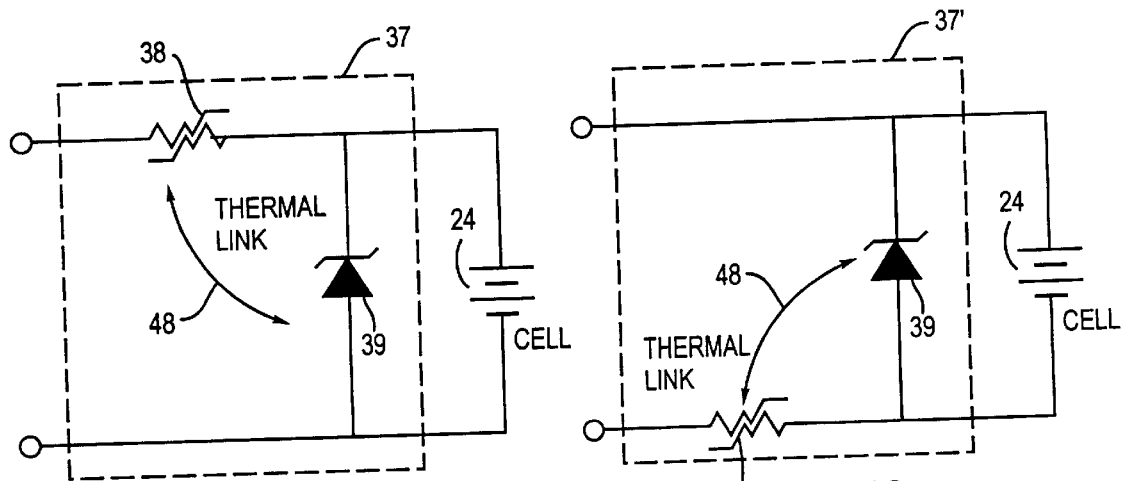
FIG. 12 is a schematic illustration of the protection circuit of FIG. 11, with the PTC device thermally coupled to the regulator.
FIG. 13 is a schematic illustration of a preferred variation of the protection circuit of FIGS. 11 and 12.

Referring to FIG. 12, the regulator 39 is preferably thermally coupled to the PTC device 38, as indicated by arrow 48. In an overvoltage condition, the regulator 39 limits the voltage across the battery cell(s) 24, causing power to be dissipated in the form of current passing through the regulator 39. This current generates heat in the regulator, which is conducted to the PTC device 38, increasing the temperature of the PTC device to its switching or "trip" temperature. At that point the PTC device 38 rapidly increases in resistance, which correspondingly substantially decreases the current passing through the regulator 39, with the thermal equilibrium of the circuit 37 determining the ultimate operating point, until the overvoltage condition is over. At that time, the regulator 39 stops conducting current, and the PTC device cools back below its trip temperature, thereby restoring the circuit 37 to its normal operating condition.

As will be apparent to those skilled in the art, the PTC device 38 may equally be deployed in the ground path of the battery charging circuit, as shown in the alternate protection circuit embodiment 37' of FIG. 13. As is explained in greater detail herein, a design choice between embodiments 37 and 37' will hinge on how the thermal link 48 between the PTC device 38 and regulator 39 is physically manifested.

In either embodiment 37 or 37', the PTC device 38 also serves to protect against an overcurrent caused by a sudden charging or discharging of the battery cell(s) 24. In particular, should there be a sudden rise in the current, the PTC device 38 will experience rapid ohmic heating from the sudden surge in dissipated power, until it trips and substantially chokes back on the current.

Importantly, in order to provide for efficient charging and discharging of the battery cell(s)24, the in-series resistance of the PTC device 38 and leakage of the regulator device 39 are preferably minimized.

Figure 4A:
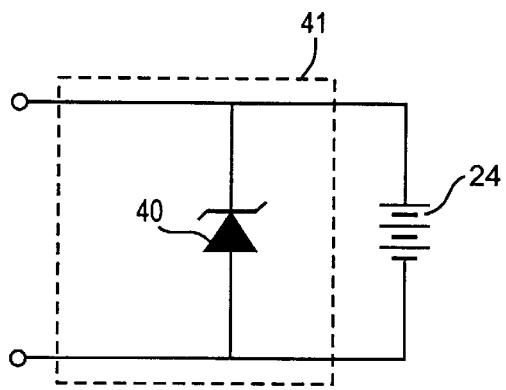
FIG. 4A is a schematic illustration of a voltage clamping circuit employing a zener diode voltage clamp in parallel with a rechargeable battery pack.
Figure 4B:
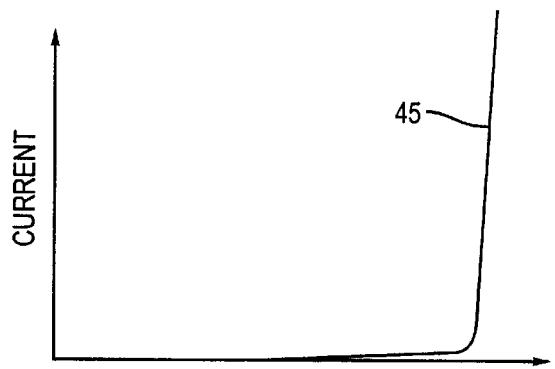
FIG. 4B depicts the current vs. voltage relationship of the clamping circuit of FIG. 4A.

Notably, the shunt regulator 39 of protection circuit embodiments 37 and 37' is expected to experience a current-voltage relationship represented by curve 45 in FIG. 4B. However, if a large surge voltage with low source resistance is applied across charger or cell terminal(s) 24, the shunt regulator 39 will be overloaded and quite possibly destroyed.

Towards this end, prior art circuits are typically characterized by low surge rating capabilities for the silicon shunt regulator. However, in accordance with a further aspect of the present inventions, a shunt regulator can be configured to have specific advantageous current-voltage relationships, so as to limit the power dissipation requirements of the regulator—i.e., so as to optimize the regulator for battery protection circuits.

Figure 14:
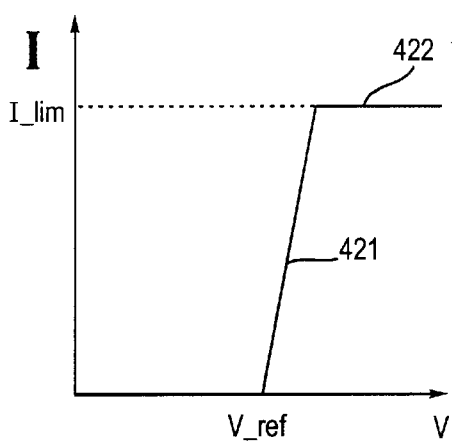
FIGS. 14–16 depict preferred current-voltage relationships for protection circuits in accordance with a further aspect of the present inventions.
Figure 15:
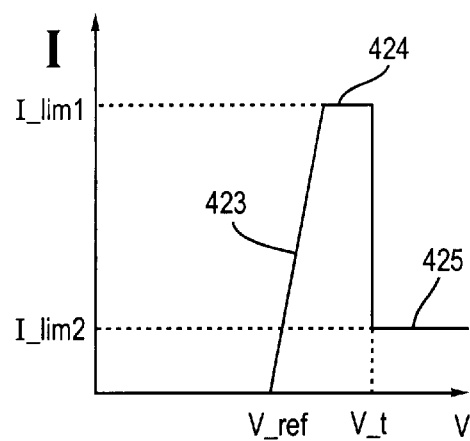
Figure 16:
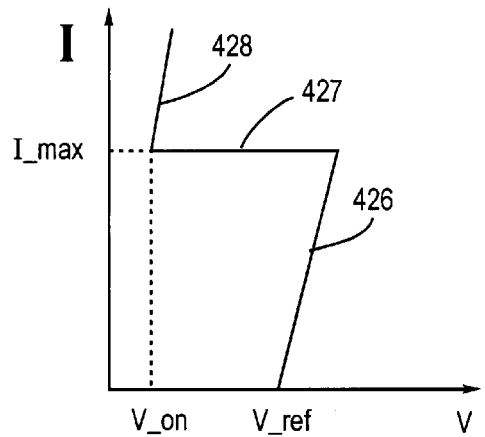

Three alternate preferred current-voltage characteristics for a protection circuit shunt regulator are presented in FIGS. 14–16.

In FIG. 14, the I–V curve 421 achieves a plateau 422 when the current I reaches a selected maximum current level I__lim. In other words, the regulator device is designed to withstand a given overload, so long as the maximum current limit for the particular design, I__lim, is not exceeded. In particular, by limiting the maximum currents and corresponding voltages for a given regulator design, the power required to be dissipated can thereby be limited.

A more complex circuit can be used to further reduce the dissipation by introducing a second current limit, triggered at a preset voltage, Vt. Towards this end, in FIG. 15, the initial portion of the curve 423 is similar to curve 421. A plateau 424, similar to plateau 422 is reached when the current reaches I__lim1. However, as the voltage level increases at constant I__lim1, thereby increasing the power dissipation requirements of the shunt regulator, the current level steps down at a trigger voltage Vt. When the voltage level reaches preset Vt, the current I drops from I__lim1 to a lower current level I__lim2 (425). This drop in current advantageously reduces power dissipation requirements of the shunt regulator.

FIG. 16 shows yet another embodiment of a preferred I–V relationship that reduces the power dissipation requirements for shunt regulators at relatively high currents. The initial slope 426 is like curves 421 and 423, prior to reaching plateaus. However, when the voltage reference reaches a value corresponding to I__max, the shunt regulator element latches to a low-voltage/high-current mode, represented by plateau 427. At Imax, the I–V characteristic of the shunt regulator are engineered to support a voltage drop to Von at Imax. At this reduced voltage level, the shunt regulator can handle higher current levels, as represented by curve 428.

Figure 17:
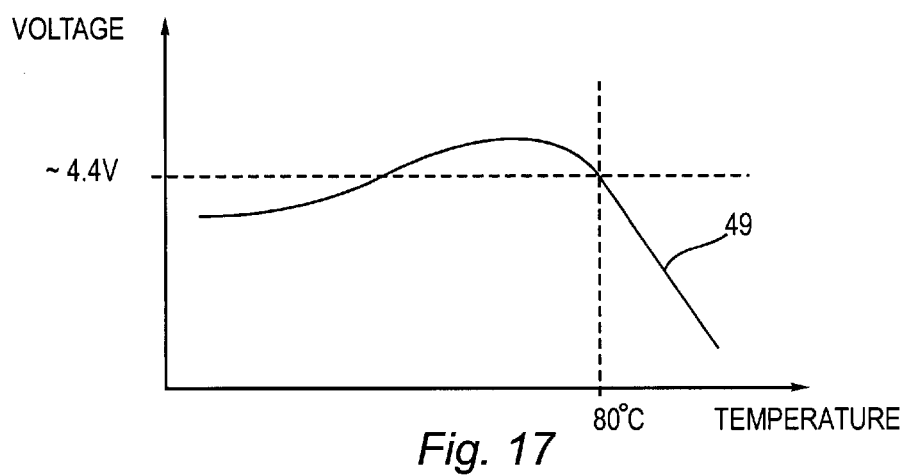
FIG. 17 depicts a preferred thermally-compensated voltage characteristic for a preferred protection circuit.

Referring to FIG. 17 with reference still to the protection circuit embodiments 37 and 37' of FIGS. 12–13, the switching voltage of the regulator 39 can also be implemented as a function of temperature. In particular, it may be desirable to implement a thermally-compensated voltage characteristic in the regulator 39, such as that represented by the temperature-voltage curve 49. In particular, a regulator 39 with a switching characteristic following the temperature-voltage curve 49 allows the switching voltage to be set significantly lower than the expected safe-use temperature of the battery 24.

For example, above a certain safe-use temperature, say 80° C., implementing the temperature-voltage curve 49 would allow the battery 24 to discharge through the regulator 39 if the safe-use temperature of the battery 24 is exceeded. In other words, the regulator 39 would act as a passive overtemperature protector, as well as a protector for overvoltage and overcurrent conditions.

As will be appreciated by those skilled in the art, many if not all of the preferred regulator embodiments disclosed and described herein could be designed or implemented to include at least one of the voltage characteristics shown in FIGS. 14–17.

Figure 18:
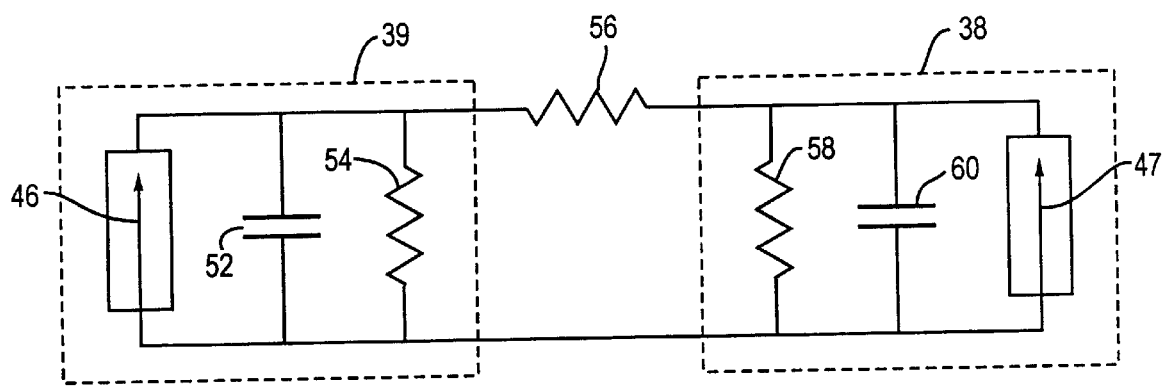
FIG. 18 is a thermal model circuit representation for the protection circuit of FIGS. 12–13.

FIG. 18 depicts an equivalent thermal circuit model for the protection circuit of FIGS. 12–13, which can be represented as an RC circuit.

In particular, for a PTC device (such as the PTC device 38), the temperature T can be determined from the following equation:

$$\frac{dE}{dt} = mCp\frac{dT}{dt} + k(T - T_a) \qquad (1)$$

where $$\frac{dE}{dt}$$

is the energy per unit time (power), m is the mass, $C_P$ is the specific heat, k is the thermal resistance and $T_a$ is the ambient temperature For a parallel RC circuit, the voltage V across the circuit is:

$$I = C\frac{dV}{dt} + \frac{V}{R} \qquad (2)$$

where I is the current into the circuit
C is the capacitance and R is the resistance.

$$\frac{dE}{dt} = mCp\frac{dT}{dt} + k(T - T_a) \quad (1)$$

where $$\frac{dE}{dt}$$

is the energy per unit time (power), m is the mass,
$C_p$ is the specific heat, k is the thermal resistance and
$T_a$ is the ambient temperature
Therefore, $$\frac{dE}{dt}$$

is analogous to I, T is analogous
to voltage V, $MC_p$ is analogous to capacitance C, and k is analogous to conductance 1/R.

Returning to the thermal model in FIG. 18, capacitance 52 represents the thermal capacitance $(mC_p)_{reg}$ of the regulator device 39, resistance 54 represents the thermal resistance $R_{\theta(Reg-Ambient)}$ of the regulator-to-ambient heat path, and the power dissipated in the regulator, $P_{d(reg)}$, is represented by current source 46. In particular, the thermal capacitance determines how much energy is required to increase the temperature of the regulator 39, i.e., the greater the thermal mass, the greater the energy required to raise the temperature. The thermal resistance determines how effectively that heat can be dissipated. A larger thermal resistance will mean that heat is not dissipated to the surroundings as effectively as it would be with a lower thermal resistance.

In a similar fashion, capacitance 60 represents the thermal capacitance $(mC_p)_{PTC}$ of the PTC device 38, resistance 58 represents the thermal resistance $R_{\theta(PTC-Ambient)}$ of the PTC-to-ambient heat path, and the power dissipated in the PTC device, $P_{d(PTC)}$, is represented by current source 47.

When power is dissipated in the regulator 39, the temperature, or "voltage" of the thermal capacitance will increase. The thermal resistance $R_{\theta(Reg-Ambient)}$ will conduct heat to the ambient, preventing the temperature of the regulator 39 from increasing indefinitely. In this regard, the lower the thermal resistance to ambient, the lower the temperature rise of the regulator element.

Likewise, some of the heat will be conducted from the regulator 39 to the PTC device 38 through the thermal resistance, $R_{\theta(Reg-PTC)}$ 56, between the regulator 39 and the PTC device 38. This thermal link causes a temperature rise in the PTC device as the temperature of the regulator 39 increases. Once the PTC device 38 reaches its switching temperature, the PTC device 38 will trip and limit the power in the regulator 38. Thus, to limit the temperature increase of the regulator 39, it is desirable for the PTC device 38 to reach its switching temperature as quickly as possible. Towards this end, the thermal resistance between the PTC device 38 and regulator 39 should be made as small as possible.

The temperature rise of the regulator 39 can also be limited by employing a PTC device with a relatively low switching temperature so that the PTC device 38 will trip relatively quickly in the event the regulator 39 begins heating up in an overvoltage or overcurrent situation. Also, by reducing the mass of the PTC device 38, its thermal capacitance 60 is reduced and, as heat is transferred into the PTC device 38, its temperature will increase more quickly. As can be observed from the circuit model of FIG. 18, it is preferable to make the thermal capacitance 60 of the PTC as small as possible. For example, U.S. Pat. No. 5,801,612 issued to Chandler et al, which is fully incorporated by reference herein for all that it teaches, discloses a preferred low temperature activated, lower mass, PTC material.

Figure 19:
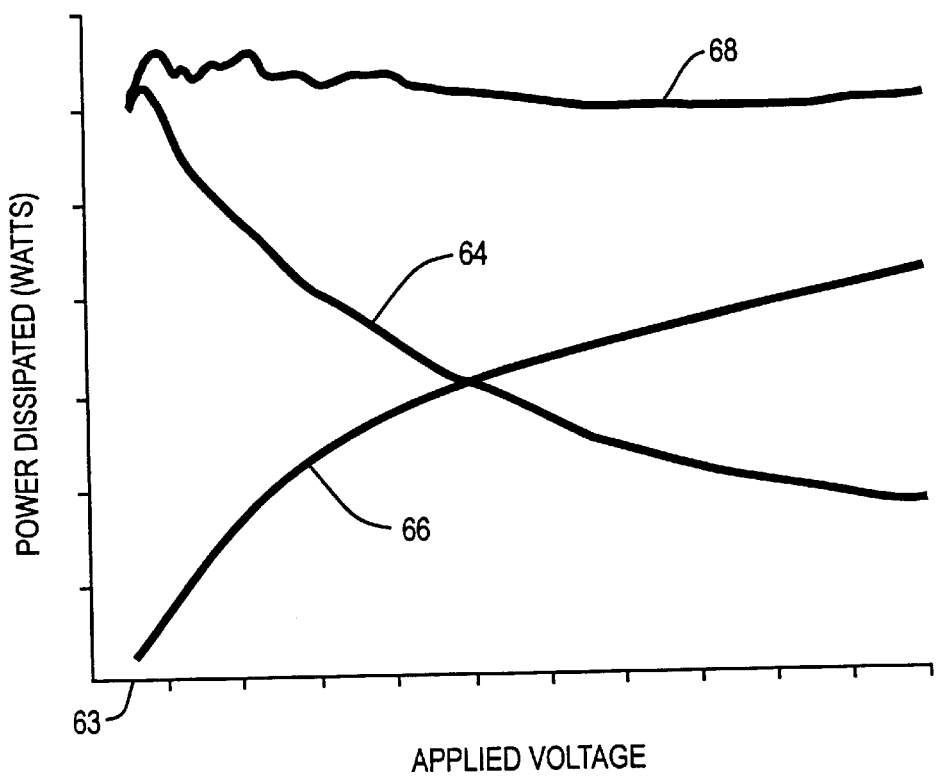
FIG. 19 depicts the power dissipated through the respective regulator and PTC device in the circuit of FIGS. 12–13 during an overvoltage condition.

Depicted in FIG. 19 is graphical representation of power dissipated in the protection circuit of FIGS. 12–13 during an overvoltage condition.

Below a certain threshold voltage 63, negligible power is dissipated by the either the regulator 39 or the PTC device 38,—i.e., the battery circuit is operating or being charged within a normal operating voltage. Should the voltage rise above a threshold maximum, however, the regulator 39 begins to conduct current and dissipate heat, which is represented by curve 64. As the PTC device 38 increases temperature due to the heat conducted from the regulator 39, it reaches its switching temperature and begins to dissipate a greater amount of power, represented by curve 66. As the PTC device 38 dissipates more power, less current passes through the regulator 39, which correspondingly dissipates less power. The total power dissipated during the overvoltage condition, represented by curve 68, remains relatively constant.

Figure 20:
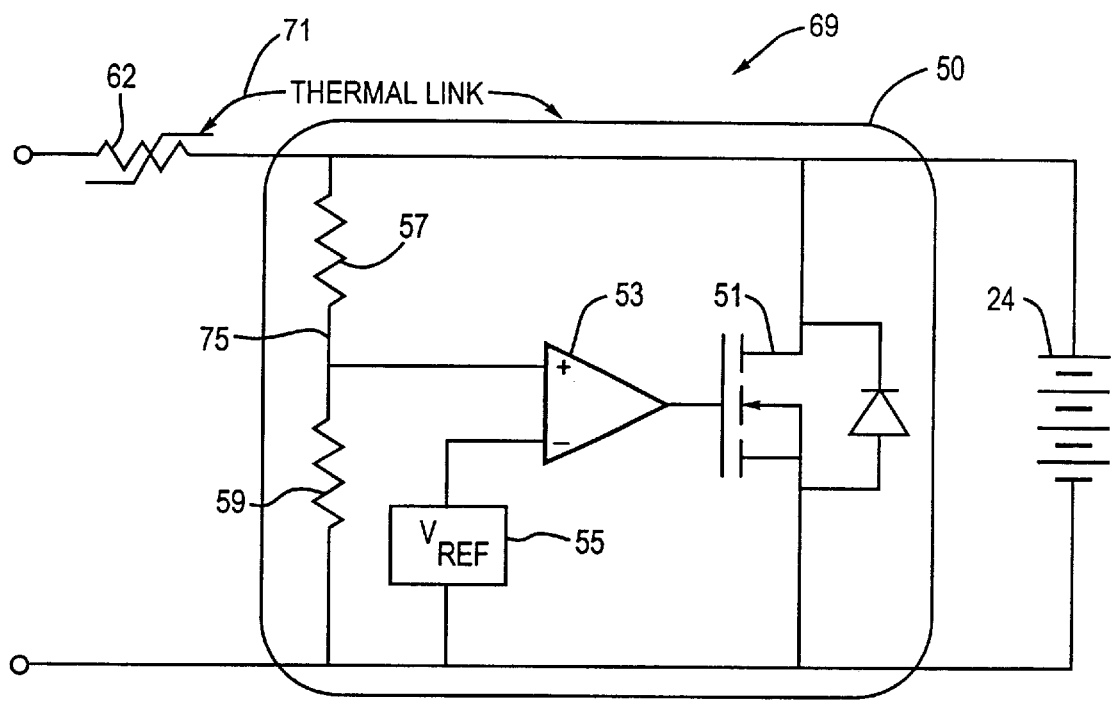
FIG. 20 is a schematic illustration of a preferred overvoltage, overcurrent protection circuit employed with a rechargeable battery pack.

FIG. 20 depicts a preferred overvoltage, overcurrent protection circuit 69 including a PTC device 62 in series, and a shunt regulator 50 in parallel, respectively, with a battery cell 24. As indicated by arrow 71, the PTC device 62, which can be a Raychem model VTP210 PTC device, is thermally coupled to the shunt regulator 50. The shunt regulator 50 comprises a MOSFET switch 51, op amp controller 53, precision reference voltage 55 and voltage divider 75, all formed on a single silicon device.

In particular, the MOSFET 51 is controlled (i.e., turned ON or OFF) by the op amp 53, which outputs a voltage signal to activate the gate of the MOSFET 51 upon detecting that the voltage across the battery cell 24 has reached a specified threshold level. Towards this end, the positive terminal of the op amp 53 is coupled to the voltage divider 75, which comprises a pair of resistors 57 and 59 in parallel with the battery cell 24. The negative terminal of the op amp 53 is coupled to the precision reference voltage 55, which in turn is connected to the negative (ground) terminal of the battery cell 24. By sizing the voltage-bridge (i.e., resistors 57 and 59) the upper voltage threshold is determined. In a preferred embodiment, the resistors 57 and 59 are trimmed for precision accuracy In the event the voltage across the battery cell 24 rises to the threshold level, the gate of the MOSFET 51 is activated. As current starts to conduct through the MOSFET 51, the voltage across the battery cell 24 is limited, thereby clamping the voltage. The gate of the MOSFET 51 is modulated to maintain the output voltage level. As described above, the current passing through the MOSFET 51 heats the silicon shunt regulator 50, which in turn heats the PTC device 62. As soon as the PTC device 62 reaches its switching temperature, the current across the circuit, and thus across the shunt regulator 50, is choked back substantially. This reduces the heat generated by the shunt regulator 50, whereby the circuit 69 will ultimately operate at its thermal equilibrium, with the current choked by the PTC device 62 and the voltage clamped by the shunt regulator 50. Because the voltage is clamped by the shunt regulator 50, the current level can rise rapidly. Preferred techniques for controlling the current and voltage through the regulator are disclosed and described below in conjunction with further preferred embodiments.

Figure 21:
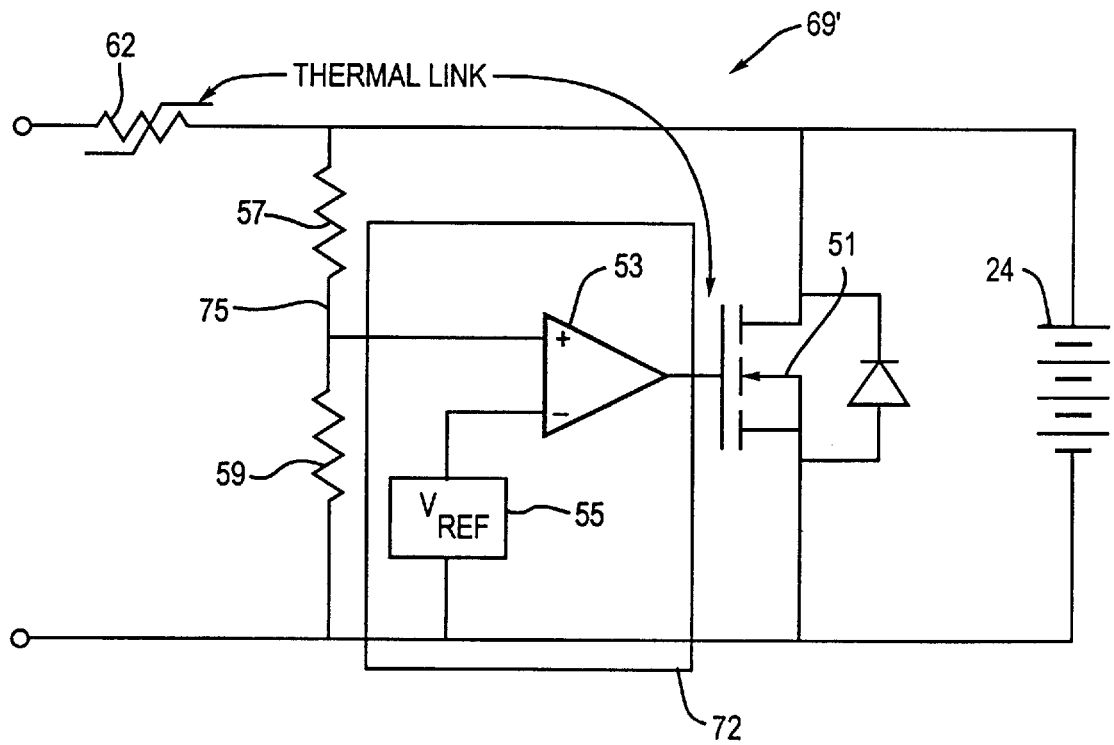
FIG. 21 is an alternate preferred embodiment of the protection circuit of FIG. 20.

FIG. 21 depicts an alternate preferred embodiment of the protection circuit, 69', wherein the op amp 53 and voltage reference 55 are formed on a separate silicon device 72 from the MOSFET 51 and voltage bridge 75. For example, a suitable combined reference 55 and op amp 53 controller is the LTC1541 model controller by Linear Technologies Corporation.

Figure 22:
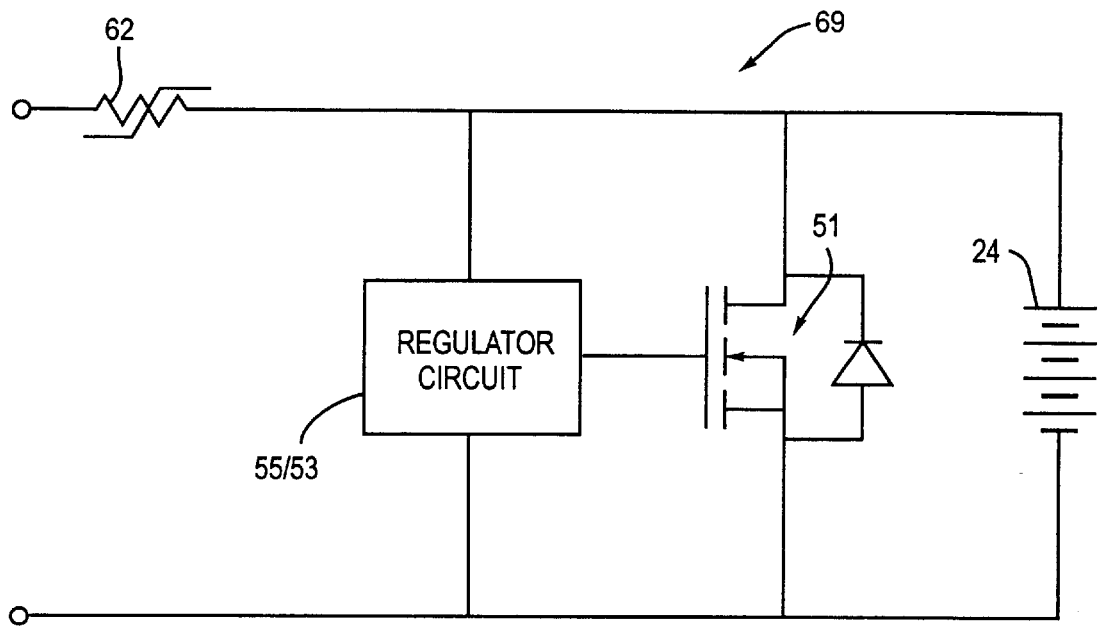
FIG. 22 is a simplified block diagram of the circuit of FIG. 20.

Referring to FIG. 22, the regulator circuit 69 (or 69') is, in effect, a precision clamping device, which drives the MOSFET 51 to regulate the voltage across the battery cell 24. Of course, the voltage reference 55 requires some amount of current for operation. As will be appreciated by those skilled in the art, the more precision the reference 55, the more current is needed for its operation. Although the amount of current is still relatively small in a typical application, e.g., in the micro-amp range, this current draw may exceed the desirable leakage level for the battery cell 24. This is especially a concern in that the shunt regulator 50 is only activated when the voltage level exceeds its normal operating range.

Figure 23:
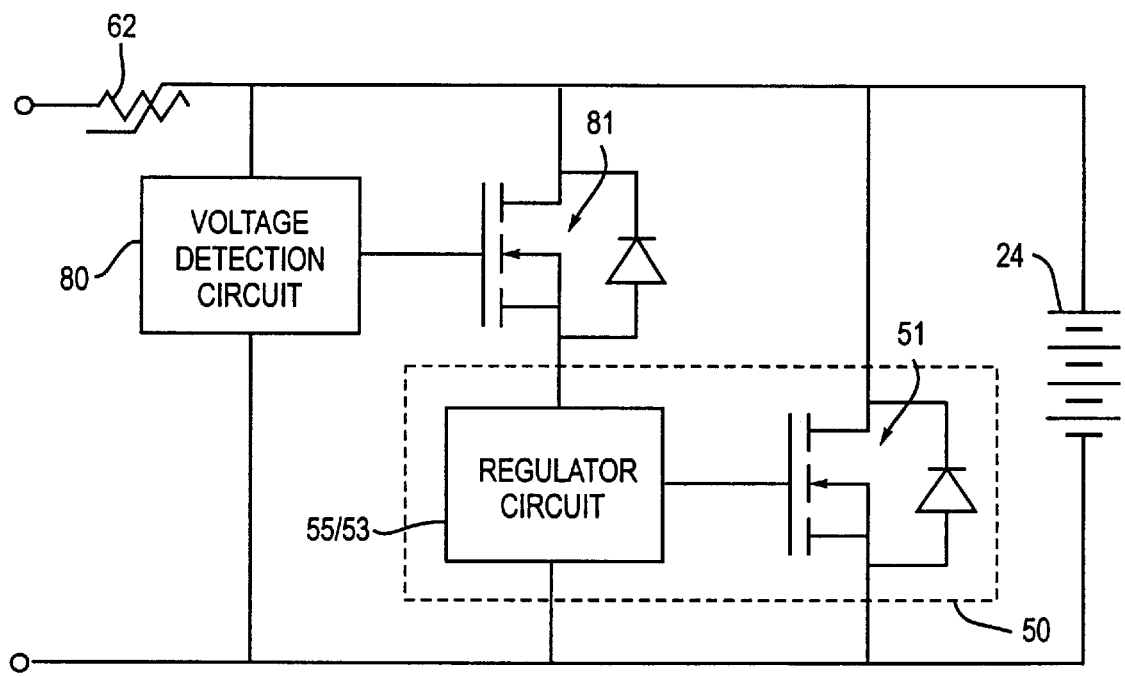
FIG. 23 is a simplified block diagram of a further alternate preferred embodiment of the circuit of FIG. 20, employing a low leakage activation circuit.

Referring to FIG. 23, in order to minimize the leakage current needed to operate the precision voltage reference 55, a firther activation circuit 80 may be employed to selectively activate the regulator control circuit 55/53 via a second MOSFET switch 81. In particular, the activation circuit 80 employs a much less precise voltage detection means (not shown) than does the shunt regulator 50, but in return has a much lower leakage current. Only when the voltage across the battery cell 24 reaches a level approaching the maximum allowable level will the activation circuit 80 turn ON MOSFET switch 81, thereby activating the regulator control circuit 55/53. Because the battery circuit will nearly always be operating below the maximum allowable voltage, the relatively higher leakage of the precision voltage reference 55 is not an issue.

Thus far, the described methods and devices have been for purposes of protecting against an overvoltage or overcurrent condition. However, it may also be desirable to protect rechargeable elements, such as rechargeable battery cells, against an undervoltage condition, i.e., due to an overdischarge.

Figure 24:
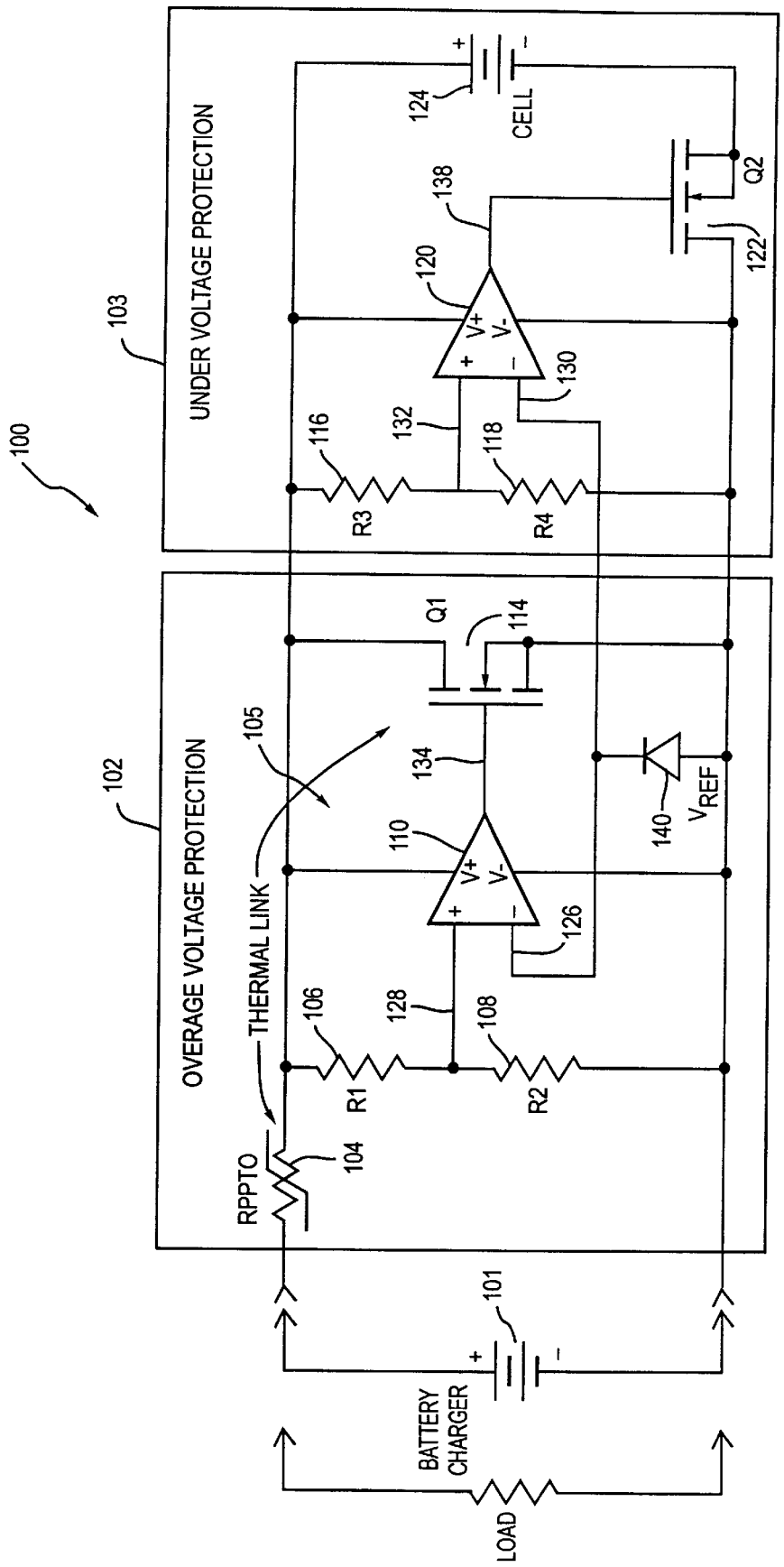
FIG. 24 is a schematic of a further preferred protection circuit, including both over and undervoltage protection circuits, in accordance with yet another aspect of the present inventions.

Towards this end, FIG. 24 shows a preferred over or undervoltage protection circuit 100 employed between a charger 101 and a rechargeable battery cell 124. The protection circuit 100 generally includes overvoltage protection circuit 102 connected in parallel with an undervoltage protection circuit 103. The overvoltage protection circuit 102 includes a PTC device 104 in series with the battery cell 124 and a shunt regulator 105 in parallel with the battery cell 124. The shunt regulator 105 includes an op amp controller 110 driving an n-channel MOSFET 114. The op amp 110 is connected at its positive input 128 to resistors 106 and 108 in a voltage divider configuration. The resistors 106 and 108 are connected in series, following the PTC device 104, between the high and low terminals of the battery charger 101 and cell 124. The negative input 126 of op amp 110 is coupled to a negative input terminal 130 of a comparator 120 in the undervoltage protection circuit 103. A reference voltage 140 couples the respective negative input terminals 126 and 130 to ground.

The output of op amp 110 is connected to the gate of the MOSFET 114. The drain and the source terminals of the MOSFET 114 are connected to the respective high and low potentials of the battery 124 and charger 101. The comparator 120 of the undervoltage protection circuit 103 is connected at its positive input 132 to resistors 116 and 118 in a voltage divider configuration. The resistors 116 and 118 are connected in series between the high and low terminals of the battery charger 101 and cell 124. The output of the comparator 120 is connected to the gate of an n-channel MOSFET 122, whose source and drain terminals are connected in series across the low (ground) terminal of the battery cell 124.

The op amp 110 monitors the potential difference between its positive and its negative inputs, and drives the output accordingly. For an operational amplifier, if the voltage at its positive input is greater than that of the negative input, the operational amplifier output is driven High. If the voltage at the positive input is lower than that of the negative input, the output of the operational amplifier is driven Low. The negative input is connected to the precision voltage reference 140. The resistors 106 and 108 provide a divider bridge, which allows a designer to choose the overvoltage limit.

In a preferred embodiment, the resistors 106 and 108 are selected to make the voltage at the positive input 128 of op amp 110 equal the reference voltage when the voltage across the cell 124 reaches a specified threshold. During an overvoltage fault condition, the voltage across the cell 124 exceeds the threshold and the voltage at the positive input of the op amp 110 becomes higher than the voltage reference 140. The op amp 110 amplifies this voltage difference between its positive input terminal 128 and negative input terminal 126 and provides an amplified signal at its output terminal 134, which switches ON MOSFET 114.

As the MOSFET 114 conducts current, the voltage across the battery cell 124 is clamped and effectively drops. The voltage at the positive input 128 of op amp 110 reduces accordingly, as does the output 134. The reduction of the output 134 of the op amp 110 causes the in-path resistance $R_{DS}$-ON of the MOSFET 114 (which is, effectively, a variable resistor) to increase. This increase in $R_{DS}$ in turn forces the voltage at the positive input 128 of the op amp 110 to increase. This alternating reduction and increase in voltage seen at input 128 continues until equilibrium is reached where the output voltage driving the gate of MOSFET 114 is such that the voltage across resistor 108 is equal to the voltage reference 140.

For the overvoltage condition, MOSFET 114 is ON and the shunt regulator 105 dissipates energy, which is thermally transferred to the PTC device 104. As described above, when the temperature of the PTC device 104 reaches its trip temperature, its resistance will dramatically mcrease, thereby choking the current flowing through the MOSFET 114. Power dissipation is then shared between the shunt regulator 105 and PTC device 104, protecting the MOSFET 114 from failure due to excessive temperature.

The undervoltage circuit protection 103 works in a manner somewhat similar to that of the overvoltage protection circuit 102. The negative input 130 of the comparator 120 is connected the voltage reference 140. The positive input of the comparator 120 is connected to a divider bridge, involving resistors 116 and 118, which monitors the voltage across the cell 124 and effectively sets an undervoltage limit. The output 138 of the comparator 120 drives the gate of the N Channel FET transistor 122, connected in series with the load.

Under normal operation, the voltage across the cell 124 is above the undervoltage limit, and the voltage at the positive input pin 132 of the comparator 120 is greater than voltage reference. Thus, the output 138 of the comparator 120 is driven High, and transistor 122 is ON, allowing the cell 124 to discharge through a load. When the voltage of the cell 124 drops below the pre-selected undervoltage limit, the output 138 of the comparator 120 is driven Low, the transistor 122 turns OFF and the cell 124 is disconnected from the load. Charging the cell 124 is now necessary to disable the undervoltage protection. Once the voltage across the cell rises above the undervoltage limit, transistor 122 turns back ON and discharging is allowed.

The output of the op amp 110 is driven high during an overvoltage fault and consequently turns ON the N-channel FET 114. While an N-channel FET is described, it is possible to use an op amp, which will provide a low output during a fault and drive the gate of a P-channel FET. Similarly, it is also possible to use a comparator that would provide a high output voltage during an undervoltage and have it drive the gate of a high side P-channel FET connected in series with the load. The configuration of the op amp 110, comparator 120 and MOSFETs 114 and 122 is flexible. Additionally, the battery pack designer is free to choose the overvoltage and undervoltage limits to satisfy any application.

For cell charging circuits, it is desirable to avoid reverse battery charging or reverse charge build-up. Reverse battery charging occurs when undesirable currents flow in a direction opposite to that necessary to charge a battery cell. Reverse currents not only decrease the efficiency of a charging circuit, but may also cause damage to the battery cell. An advantage of the preferred protection circuit 69 is that its current limiting properties will also serve to choke back harmful reverse current flow.

Figure 25:
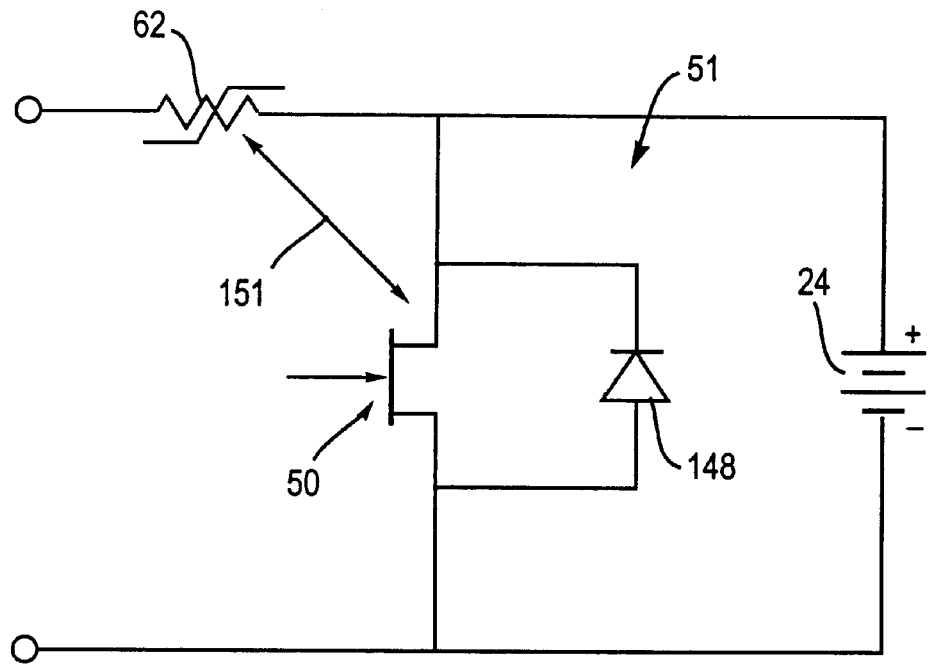
FIG. 25 is a schematic showing the body diode of the regulator MOSFET element in FIG. 20.

With reference to FIG. 25, the build-up of any reverse current passing by the shunt regulator MOSFET 51 will be conducted through its body diode 148. In particular, the passing of sufficient reverse current will create a heat path through diode 148, thereby generating ohmic heating of the shunt regulator device 50 due to the power dissipated by the current. As described in detail above, the heat is conducted through the thermal path (indicated by arrow 151) from the shunt regulator 50 to the PTC device 62, until the PTC device reaches its switching temperature and trips, thereby substantially choking back on the reverse current.

Should additional protection be desired, e.g., for situations where large power dissipation through the body diode 148 is undesirable, further diode resistance 152 (shown in FIG. 26) is preferably in series with body diode 148 (i.e., within the MOSFET silicon), in order to generate heat when conducting reverse currents. The additional heat generated helps to create the heat path to the PTC device 62 without relying solely on the body diode 148 and, importantly, without requiring the diode 148 to dissipate as much power to trip the PTC device 62. In effect, the resistive path through diode resistance 152 can extend the reliability and expected life of the MOSFET 51. Further, since the resistance 152 can generate heat faster than the body diode 148 alone, the heat path to the PTC device 62 is generated more rapidly.

Figure 26:
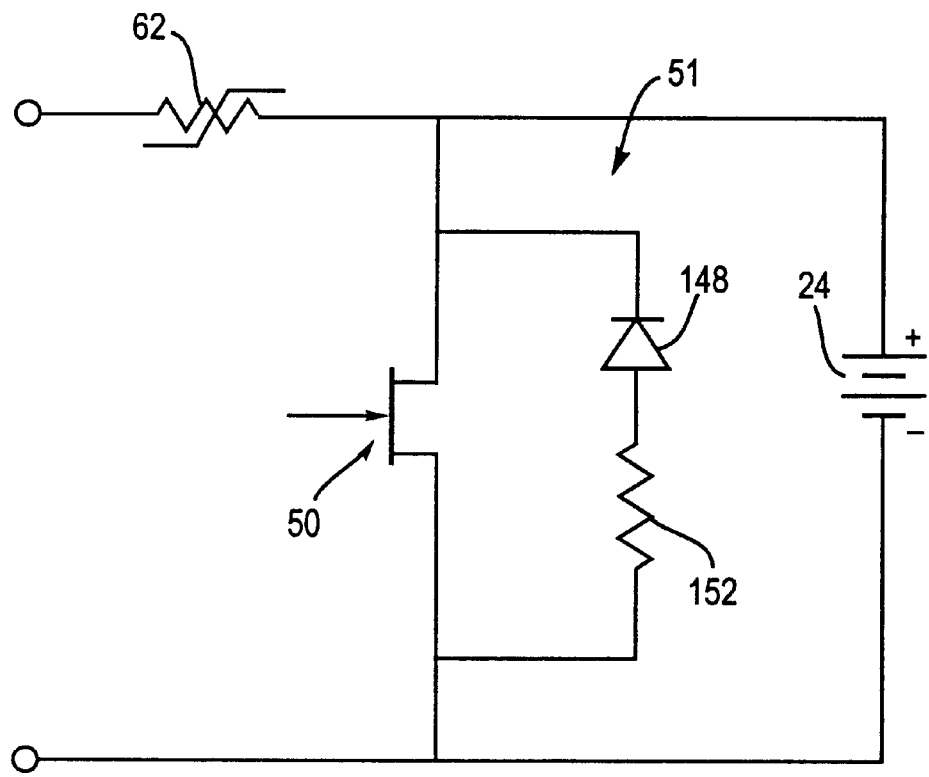
FIG. 26 is a schematic showing the addition of a resistance in series with the body diode in the MOSFET of FIG. 25.
Figure 27:
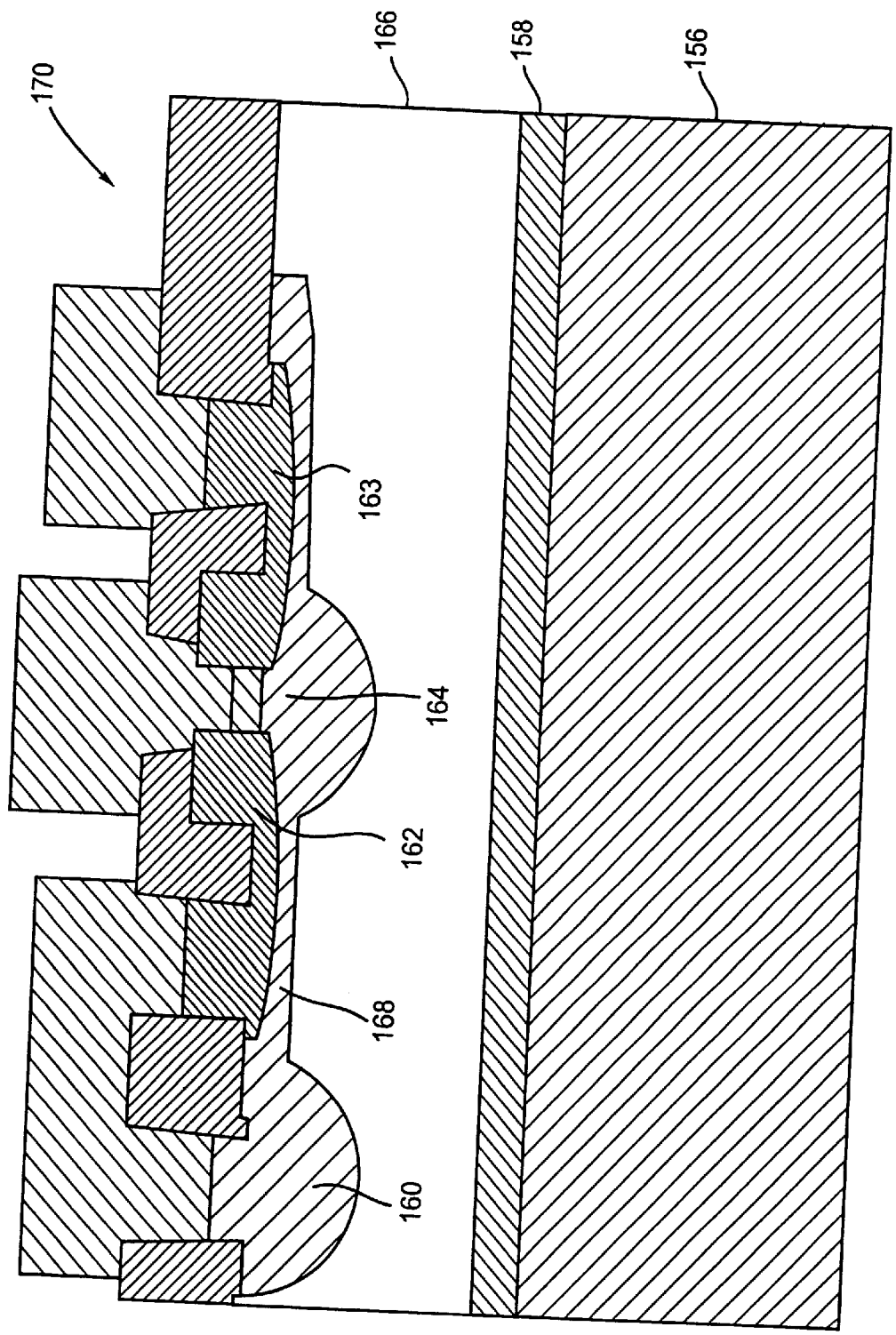
FIG. 27 is a cross-sectional view of a preferred MOSFET device for use as the shunt regulator with the added series resistance in the protection circuit of FIG. 26.

FIG. 27 is a cross-sectional view of a preferred MOSFET device 170 for use as the shunt regulator with the added series resistance in the protection circuit of FIG. 26. The MOSFET 170 is designed so that its channel 164 will generate heat. In particular, a PTC device 156 is coupled to N-type silicon 166 be a lead frame 158. The diode/resistor combination 148 and 152 of FIG. 26 can be implemented as a p-n junction where the resistance of diode can be determined by a body path in a transistor. To make the body path more resistive, the path is made longer. To increase the body path resistance, a body contact 160 is placed away from the channel 164. If the body-to-drain diode is forward biased, as is the case with the configuration of the respective source and drain terminals 162 and 163 in device 170, the P-drift region 168 will heat up when conducting current.

Without the added resistance to the diode in a conventional MOSFET, a forward-biased diode can destroy the package before sufficient heat is generated to trip the PTC device. By employing a more resistive diode, more heat can be generated as necessary to create the heat path to conduct away reverse currents. A more resistive diode configuration offers a higher breakdown point while, in some embodiments, allowing the heat path to be generated more rapidly. An additional advantage over "smart" semiconductor devices is that, after failure, a PTC device will still be in place to interrupt potentially damaging current flow.

Figure 28:
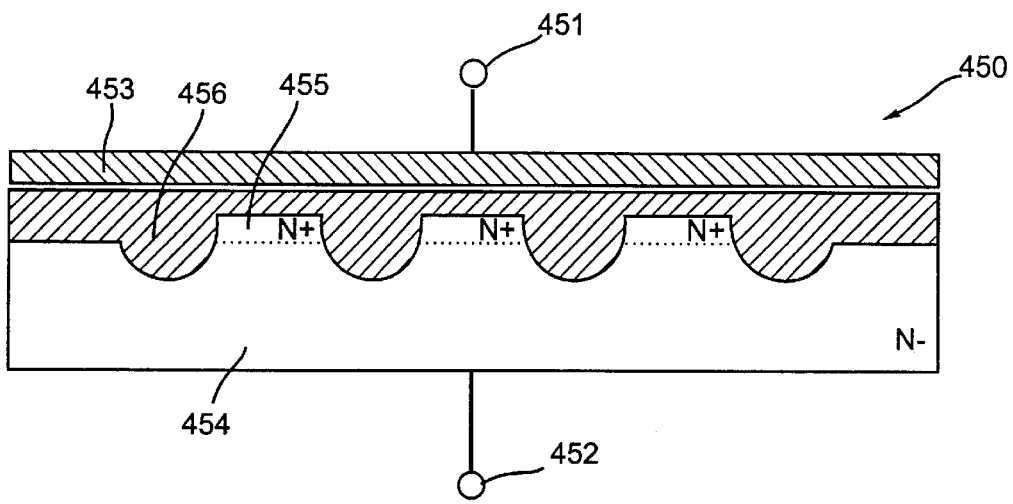
FIG. 28 illustrates an alternate preferred semiconductor device for use in preventing reverse battery discharge, in accordance with a still further aspect of the present inventions.
Figure 29:
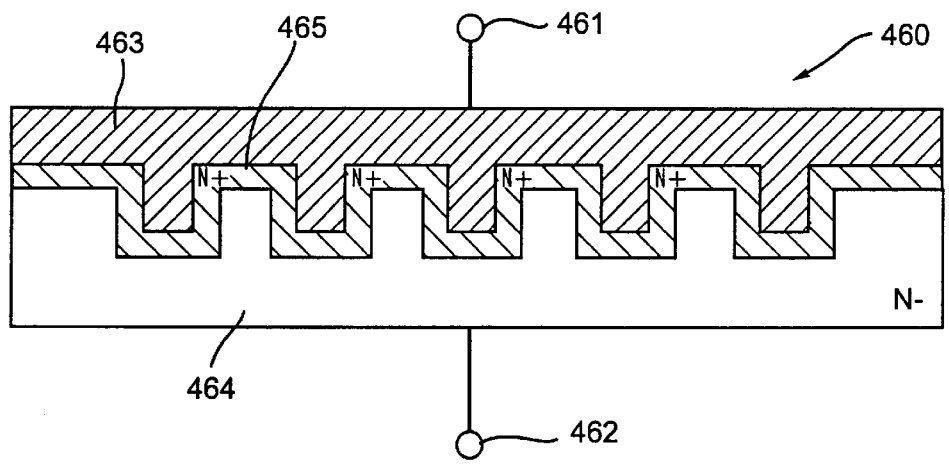
FIG. 29 illustrates a further alternate preferred semiconductor device for use in preventing reverse battery discharge.

In accordance with a still further aspect of the disclosed inventions, FIGS. 28 and 29 show preferred semiconductor devices for protecting against reverse battery discharge,— i.e., for limiting channel current to an acceptable level in the "reverse" direction, while presenting little ohmic resistance in the "forward" direction.

More particularly, FIG. 28 depicts a diffused structure 450 having a top contact 451 and bottom contact 452 connected to a JFET region 454. The top contact is connected to a metal, or ohmic contact, 453. When the top contact 451 is positively biased relative to the bottom contact 452, a large current will flow through the JFET region 454. This positive bias is shown as curve segment 458 in FIG. 30. If the voltage is reversed (i.e., negative top contact 451 relative to bottom contact 452), the current passing through the JFET region 454 will initially have an ohmic behavior.

Figure 30:
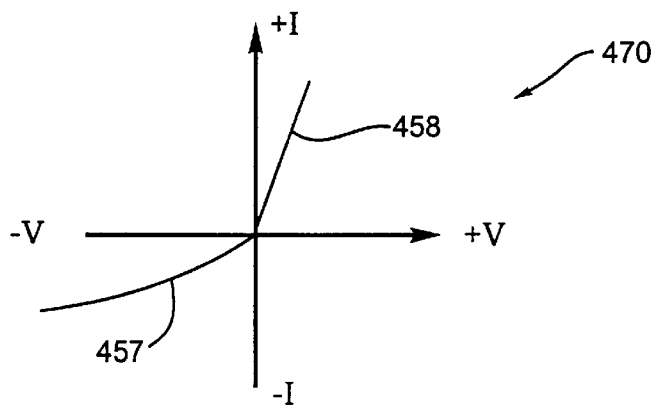
FIG. 30 depicts a preferred current-voltage curve for the devices of FIGS. 28 and 29.

The reverse bias is shown as curve segment 457 in FIG. 30. As the reverse current increases, the pn junction between regions 455 and 456 becomes increasing reverse biased. The reverse bias creates a depletion region and further obstructs current flow through the JFET region 454. This restriction in current flow limits the maximum value of the reverse current to a manageable level.

FIG. 29 depicts a trench structure 460 having a top contact 461 and bottom contact 462 connected to a JFET region 464. The top contact is connected to a metal, or ohmic contact 463. When the top contact 461 is positively biased relative to the bottom contact 462 a large current will flow through the JFET region 464. This positive bias is shown as curve segment 458 in FIG. 30. If the voltage is reversed (i.e., negative top contact 461 relative to bottom contact 462) the current passing through the JFET region 464 will initially have an ohmic behavior. The reverse bias is shown as curve segment 467 in FIG. 30. As the reverse current increases, the gate effect creates a depletion region inside the trench channel 465. The depletion region further obstructs current flow through the region 454 and limits the maximum value of the reverse current at a manageable level.

With reference again to FIG. 26, the current limiting PTC device 62 and shunt regulator 50 work in tandem to protect the battery cell 24 from overcharging or being exposed to overvoltage conditions. when an overvoltage condition occurs, excess power must be dissipated through the shunt device 50 (in particular the MOSFET 51), so as to avoid any damage of the device.

In particular, in order to protect the battery cell 24, the shunt regulator device 50 must be able to withstand significant current surges until the PTC device 62 trips. One, previously discussed, approach to minimize this exposure is to design the PTC device 62 to trip at relatively low temperatures. There are limits to this approach, however, in that the PTC device 62 must allow for sufficient current conduction during normal operation (i.e., charging or discharging) of the battery cell, without tripping due to internal ohmic heating.

Generally, by being able to use devices in a protection circuit that does not have to withstand high power or high voltages, less costly devices can be used, or circuits requiring less topology (i.e., "silicon") may be employed.

As has been described herein, as current flows into the regulator, the regulator heats and raises the resistance of the PTC device to limit current in the regulator. The current in the regulator and PTC device stabilizes at a value such that the power dissipation in the respective devices is enough to keep the PTC device on the steep portion of its resistance versus temperature (i.e., "R(T)") curve (e.g., 1 to 1.5 watts when using a Raychem VTP210PTC device). This technique is adequate to prevent damage to the regulator during relatively small to moderate overcurrent conditions.

For higher power transient events where the current can reach large values, however, the delay for the heat from the regulator to assist in tripping the PTC device is determined by the thermal time constants for the heat to flow into the PTC device. Due to this lag, the silicon of the regulator can reach very high temperatures where it can possibly be damaged before the PTC device trips. While the regulator silicon san be increased in size to handle large surges of current, this adds significant cost to the device.

FIG. 31 depicts a protection circuit for a cell 180 using a shunt regulator 182 and PTC device 184. The voltage across the cell 180 and the shunt 182 must be identical since the devices are in parallel. Unlike the ideal situation, in preactice, a clamp region of the device cannot be absolutely vertical, as is illustrated in FIG. 32. For current to flow in the regulator, the voltage across it must increase a small Δ V. As this small Δ V also appears across the cell 180, the cell 180 will try to charge and draw some current from a supply 186. This added current flows through, and will assist in tripping, the PTC device 184. The larger the Δ V, the greater the current flowing into the cell 180 and, therefore, the quicker the PTC device 184 will trip via the thermal link 188.

For transient conditions, the cell 180 can be envisioned as a voltage source (or ver large capacitor) with a series resistance equal to the internal resistance of the cell 180. The voltage of the source (or capacitor) is equal to the voltage of the cell 180 before the transient occured. As an example, if a cell has an internal impedance of 0.1 Ω, the cell would draw 10 additonal amps through the PTC device if the voltage increased by a Δ V of 1 V. The current through the regulator would be the current on the I-V curve (FIG. 32) at the higher voltage. At the higher voltage, the total current will increase through the PTC device 184, which would trip much quicker than in a situation where no cell 180 is present.

Having the regulator with a shallow slope in a clamp region protects the silicon under transient conditions, but has a negative impact on the performance of the cell 180 during slow moving faults. A problem can arise if the voltage is increased very slowly, since increasing the voltage slowly allows the cell 180 to "trickle charge" and a large Δ V across the cell will not be present as the voltage increases. The cell voltage will track the I-V curve of the regulator, until the regulator conducts enough currnet to heat and trip the PTC device. In some cases, however, the extra voltage build-up will unacceptably degrade cell performance or damage the cell 180. In practice, for optimal performance, the I-V characteristic must be as steep as possible to prevent the cell 180 from overcharging due to a "trickle charge".

Thus, there appear to be two requirements. On one hand, high fault transients require large silicon or shallow sloped clamp regions. On the other hand, slow moving faults usually require much steeper clamp regions. ideally, the solution is to make a device, which will have the I-V characteristic as shown in FIG. 33. For low current fault events, such as is the case for a slowly rising voltage, the device acts as a clamp and prevents the voltage from increasing past the clamp voltage. The minimum current required through the device in order to cause the PTC device to trip would reside on the steep portion 190. For slow moving faults with low potential current, the device would operate just as a clamp with a very steep clamp region 190. For faults with larger currents, the clamp limits the current to a set value 192 and allows the voltage to increase. With a cell attached, this increase in voltage will draw a large current from the cell and assist in tripping the PTC device. Once the PTC device has tripped, the voltage across the protection device and cell will be reduced and the maximum voltage across the cell and device that can be obtained will be the voltage at the steep portion 190. Notably, since the minimum current required to trip the PTC is on the steep portion of the curve, as sustained overvoltage condition cannot be obtained.

In the preferred protection circuit of FIG. 34, an operational amplifier 200 monitors the potential difference between its positive and its negative inputs 202 and 204, respectively, and drives the output 206 accordingly. If the voltage at its positive input 202 is greater than that of the negative input 204, the operational amplifier output 206 is driven High. If the voltage at the positive input 202 is lower than that of the negative input 204, the output 206 of the operational amplifier 200 is driven Low. The negative input is connected to a voltage reference 208. The resistors 210 and 212 provide a divider bridge, which allows a designer to select any overvoltage limit for the cell 222.

Figure 35:
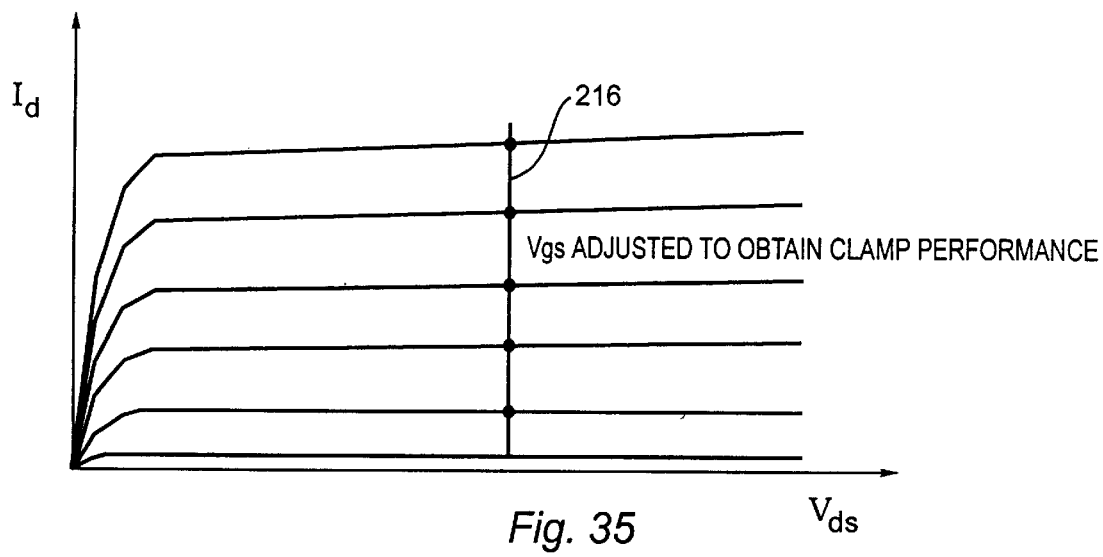
FIG. 35 depicts the current-voltage relationship of the circuit of FIG. 34.

In particular, the operational amplifier 200 adjusts the gate voltage on the FET 214 to force the device to have a clamp IV characteristic. FIG. 35 depicts a family of $I_d$-$V_{ds}$ characteristics for an n-channel FET. As shown, $V_{gs}$ can be adjusted along vertical slope 216 to obtain clamp performance. Depending on the gate-source voltage, the drain current can take any value at a particular drain-to-source voltage.

To obtain the desired characteristic, the voltage at the gate 206 of the FET 214 can be set to not exceed a set value. This can be done, for example, by clamping the gate voltage, as shown in FIG. 36.

Figure 36:
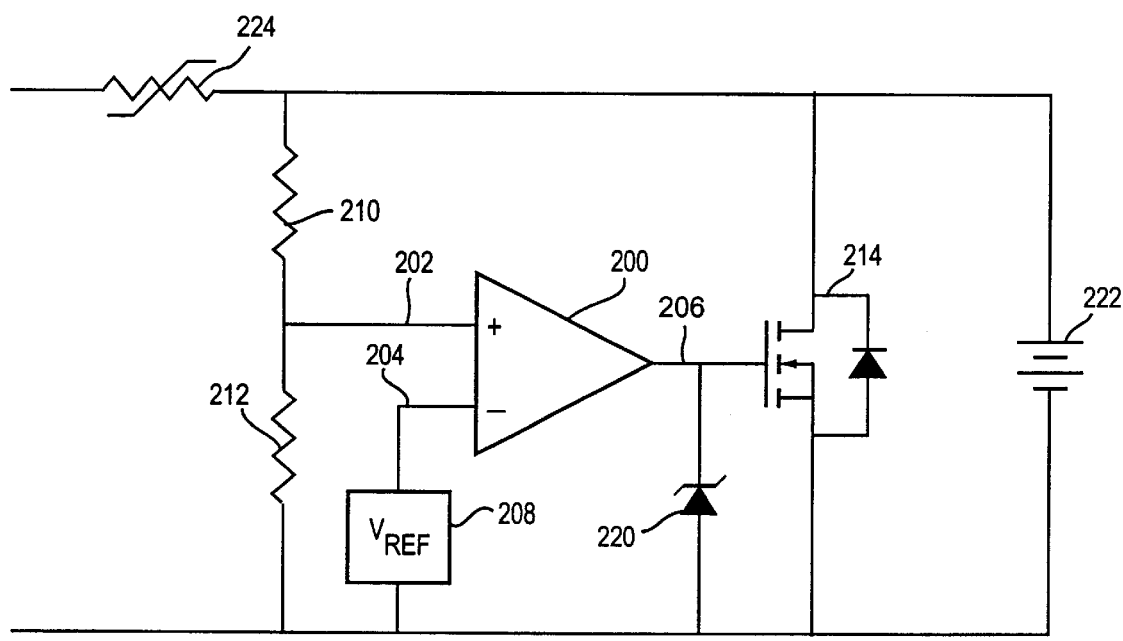
FIG. 36 is a simplified schematic of a yet another preferred overvoltage protection circuit.
Figure 37:
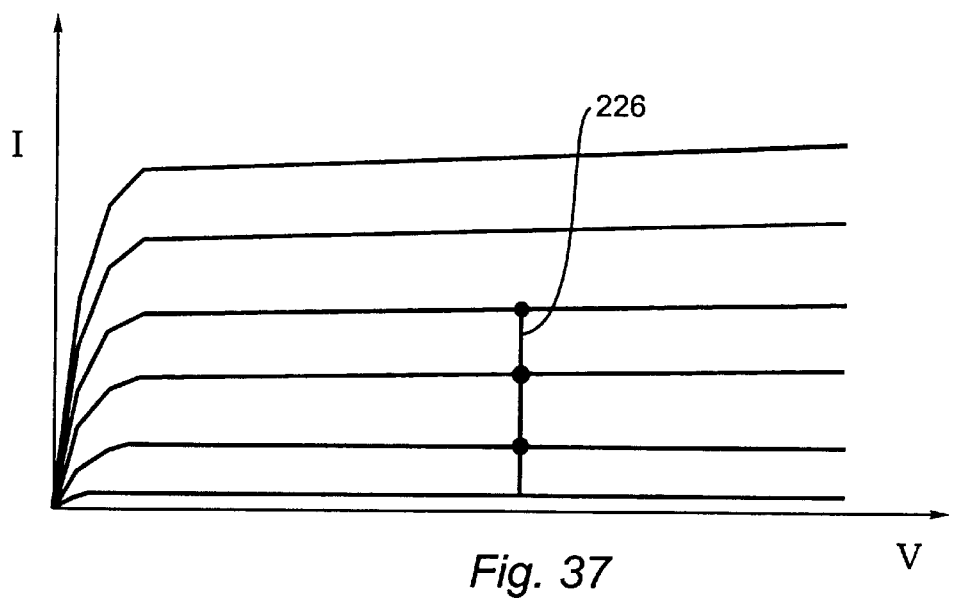
FIGS. 37–38 depicts the current-voltage relationship of the circuit of FIG. 36.

In particular, FIG. 36 depicts the same circuit as FIG. 34, except that a zener diode 220 is attached between the output 206 and ground. By introducing the zener diode 220, the voltage at the gate of the FET 214 is limited. The zener diode 220 effectively clamps the gate voltage of the FET 214, allowing the voltage across the battery 222 to increase and directing more current to the battery 222. As shown in FIG. 37, $V_{gs}$ can be adjusted to obtain clamp performance and/or clamp the voltage at 206, so that the FET operates in saturation.

A key to this approach is that the circuit actually directs power to a battery cell and away from a FET 214. Such an approach recognizes that in some configurations a battery 222 can easily absorb some additional voltage and/or current from 206 for a set duration. By absorbing additional voltage and/or current, the FET is protected. Because of the reduced performance requirements on the FET 214, a less costly FET, or one taking less space, can be used.

The PTC device 224, in series with the battery 222, will also see the higher currents. As the higher currents are exposed to the PTC device 224, the PTC device will trip more quickly and advantageously dissipate power. In this way, while the battery will be exposed to higher voltage and currents, the PTC device will trip to dissipate power before the battery 222 is exposed to any powre levels, which may damage the battery. Simply, any high currents seen be the battery 222 also pass the PTC device 224; these higher currents trip the PTC device before the battery 222 is exposed to any damaging power levels.

Figure 38:
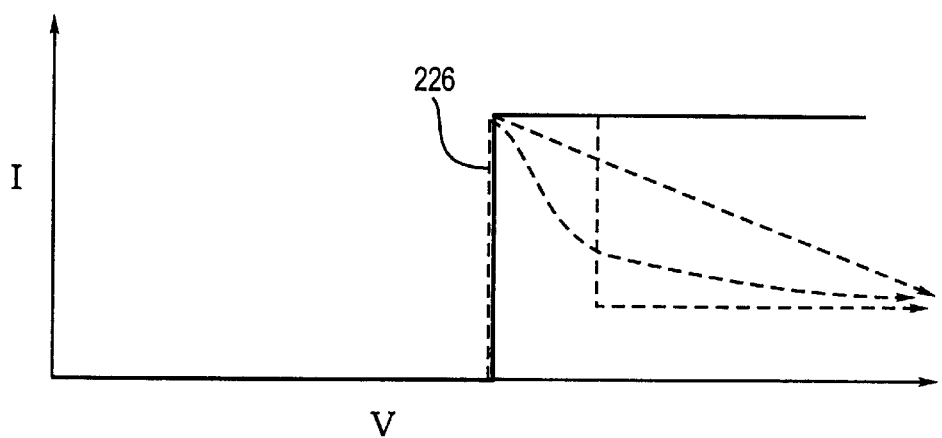

While the I-V characteristcs shown in FIG. 37 represent one configuration, further optimization may be obtained by changing the I-V characteristic even further after the vertical section 226. Possible I-V characteristics are shown in FIG. 38. By reducing the current after clamp region, the power dissipated in the device is reduced during the transient event and may result in further silicon size reductions.

The above approach takes advantage of the fact that the battery 222 can withstand some additonal current and voltage levels before the PTC device trips. As in any embodiment disclosed herein, in order to assure that the battery 222 is not exposed to damaging powre levels caused by extreme voltage and/or current levels or by failure of the regulator, a thermal fuse or regular fuse can be used to isolate the battery.

Figure 39:
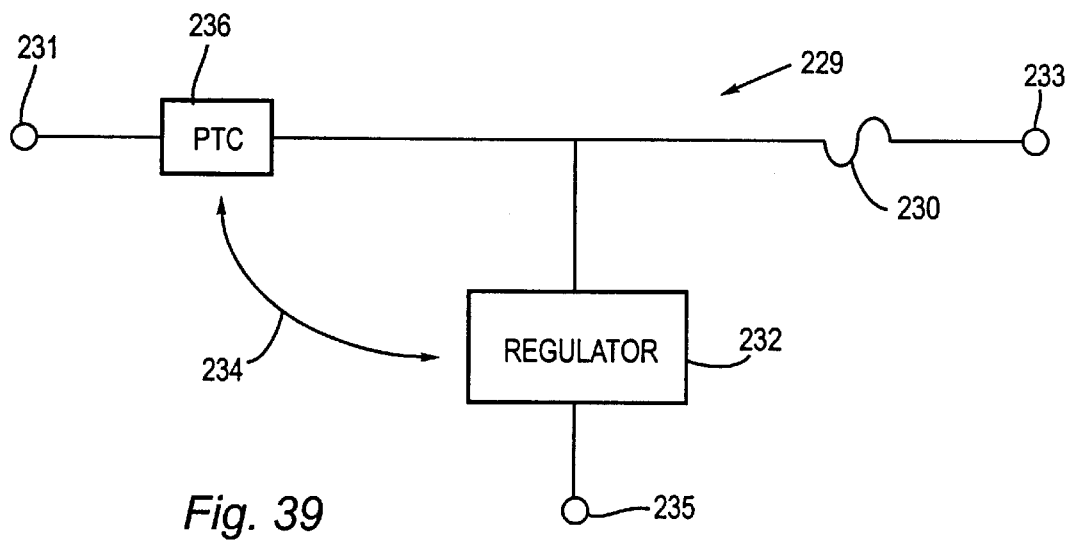
FIG. 39 is a simplified schematic of a preferred three terminal protection circuit.

Referring to FIG. 39, a preferred battery protection circuit is embodied in a three terminal battery protedtion device 229, which generally comprises a PTC device 236 thermally coupled with a MOSFET regulator switch 232. In particular, a first terminal 231 of the protection device 229 couples to a positive lead of an external charging cource or discharging load (not shown), to an input terminal of the PTC device 236. A second terminal 233 of the protection device 229 couples bother an output terminal of the PTC device 236 and a drain terminal of the MOSFET regulator 232 to the positive terminal of a battery (not shown). A third terminal 235 of the protection device 229 couples the negative terminal of the battery to the source of the regulator 232 and to the ground terminal of the charging source or discharging load.

As indicated by arrow 234, the drain terminal of the regulator 232 forms bother a thermal and electrical link to the PTC device 236. A fuse 230 such as, e.g., a bond wire or solder bond, is placed in series with the second terminal 233 in order to provide a last measure of protection to the battery.

For purposes of better illustrating still further aspects of the inventions disclosed herein, variations of device 229 are now described.

Figure 40:
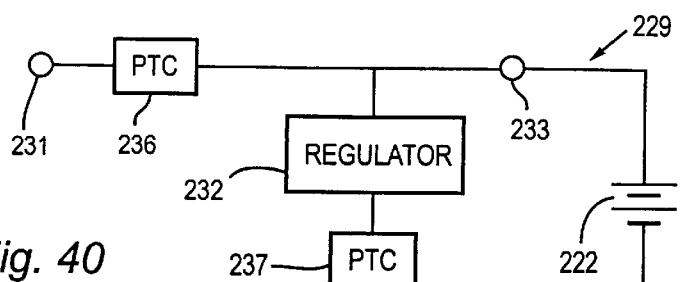
FIGS. 40–42 are simplified schematic diagrams of alternate embodiments of the three terminal protection device of FIG. 39.
Figure 41:
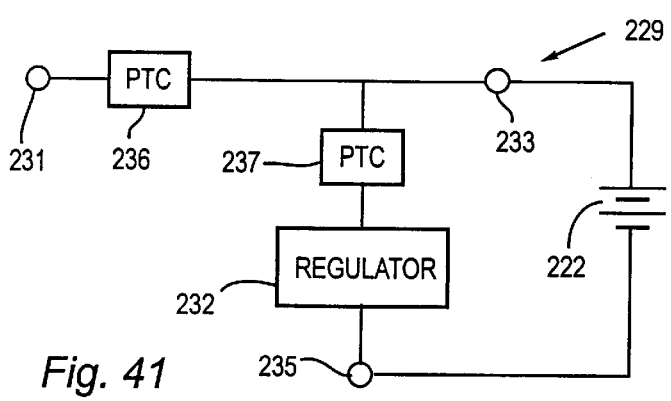

Referring to FIGS. 40 and 41, in lieu of (or in addition to) fuse 230, an additional PTC device 237 can be added in series with the MOSFET regulator 232 to provide further protection should the regulator 232 fail and short circuit. Notably, the additional, or "parallel" PTC device 237 may be coupled to either the source (FIG. 40) or drain (FIG. 41) of the MOSFET regulator 232. In a preferred embodiment, the parallel PTC 237 device is configured to trip before the current passing through it and the regulator 232 generates sufficient ohmic heat to cause the regulator 232 to fail and short circuit.

Although the parallel PTC device 237 would not increase the path resistance seen by a battery 222 being protected by the device 229, if the parallel PTC device 237 were to inadvertently trip due to excess thermal heat or otherwise fail open during normal operation of the battery 222, the regulator 232 would no longer be coupled across the battery 222. One approach to minimize the chance of this occurring is for the parallel PTC device 237 to have a higher transition temperature (i.e., higher threshold trip current) than the "series" PTC device 236, to insure that the series PTC device 236 will trip before the parallel PTC device 237. In this scenario, the parallel PTC device 237 still plays a protection role with respect to preventing further discharge from the battery 222 through the regulator 232, after the series PTC device 236 has tripped.

Figure 42:
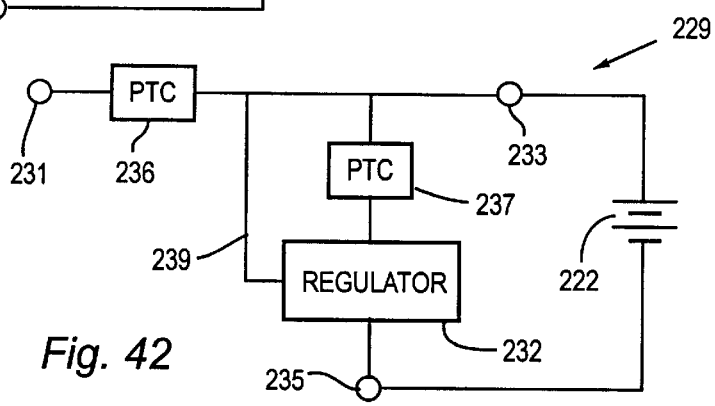

As shown in FIG. 42, with the added parallel PTC device 237, the MOSFET regulator 232 is preferably configured to sense the voltage across the battery path via path 239, without the added resistance of the parallel PTC device 237.

Figure 43:
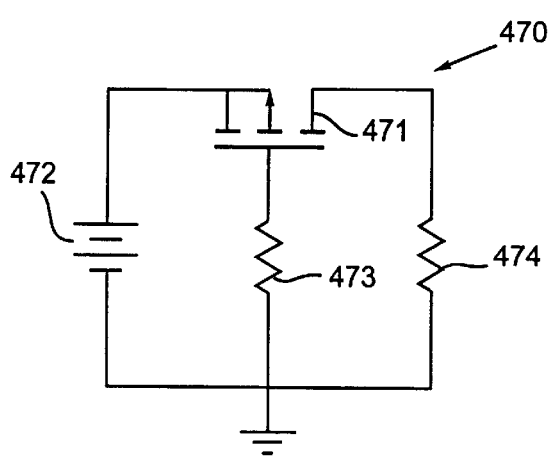
FIG. 43 is a simplified schematic diagram of a prior art overdischarge protection circuit for preventing overdischarge of a battery.

Turning now to still further aspects of the present inventions disclosed herein, it is generally known that lithium-ion batteries should be prevented from being overdischarged. FIG. 43 represents a typical prior art circuit 470 employed for preventing overdischarge of a battery 472. In particular, a FET 471 having a gate resistance 473 is connected in series with the battery 472 and a load 474. Once a preset low battery voltage is reached, the FET 471 will automatically turn OFF, thereby preventing the battery 472 from further discharging across the load 474. However, during the battery discharge process, the FET 471 is subjected to relatively high powr dissipation, which may increase its temperature above acceptable limits. In particular, this thermal stress can damage the FET 471, such that the overdischarge protection circuit 470 may fail.

Figure 44:
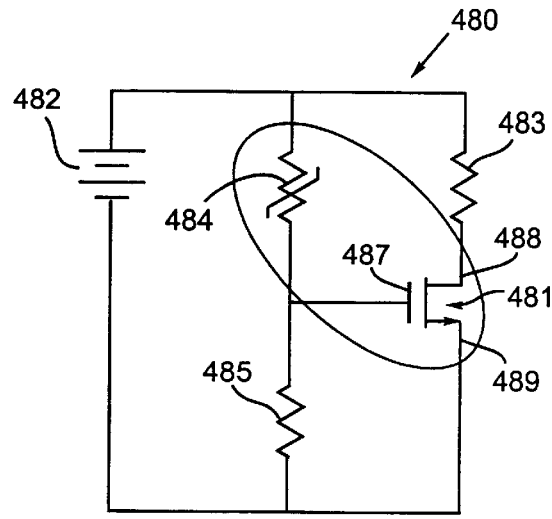
FIG. 44 is a simplified schematic diagram of a preferred overdischarge protection circuit, in accordance with yet another aspect of the present inventions.

Referring to FIG. 44, a preferred overdischarge protection circuit 480, which also provides protection in case of overcharging, employs a FET device 481 in series with a battery 482 and load 483. In particular, the FET 481 has it source terminal 488 coupled to the output of the load 483 and its drain terminal 489 coupled with the negative terminal of a battery 482. The positive terminal of the battery 482 is coupled to the input of the load 485, so that, when the FET 481 is ON, the battery 482 will discharge through the load 483.

A PTC device 484 is inserted in the reverse discharge protection circuit 480 in parallel with the respective battery 482 and load 483. The gate terminal 487 of the FET device 481 is with the respective battery 482 and load 483. The gate terminal 487 of the FET device 481 is coupled in a divider configuration the PTC device 484 and a resistor 485. The respective (low temperature) resistances of the PTC device 484 and resistor 485 are sized such that the voltage seen at the gate terminal 487 of the FET device 481 will keep the device ON, so long as the voltage stays above the full discharge level of the battery 482. In one preferred embodiment, for a typical rechargeable lithium battery pack, the low temperature resistance of the PTC device 484 is selected at about 10 kohms, and the value of the resistor 481 is 1 Mohms.

In accordance with this aspect of the inventions disclosed herein, the PTC device 484 is thermally coupled to the FET device 481 as a further protection against failure of the FET device 481 in case of overcharging of the battery 482. As the voltage across the PTC device 484 and, thus, the FET device 481, approaches a level that might otherwise cause the FET device 481 to fail, current flowing through the PTC device 484 will sufficiently heat the device 484 to its trip temperature. Once PTC device 484 trips to it's high resistance state, the voltage across the device 484 will immediately drop to a level below the threshold gate voltage of the FET device 481, causing the FET to turn OFF.

In a preferred embodiment, the PTC device 484, FET device 481 and resistor 485 are sized such that the PTC device 484 will trip to high resistance and shut off the FET device 481 well before a failure of the FET device 481 is possible due to the rising current caused by an overcharging condition. By way of example, in a preferred embodiment employed for protection of a rechargeable lithium battery, the PTC device 484 has a (non-tripped) resistance value about 10 kohms and resistor 483 has a value about 1 Mohms. Notably, the protection circuit 480 can be optimized for various configurations and FET characteristics by modifying the ratio of resistors 484 and 485.

In accordance with further aspects of the inventions disclosed herein, rechargeable battery protection devices and preferred methods for their manufacture and assembly will now be described.

Figure 45:
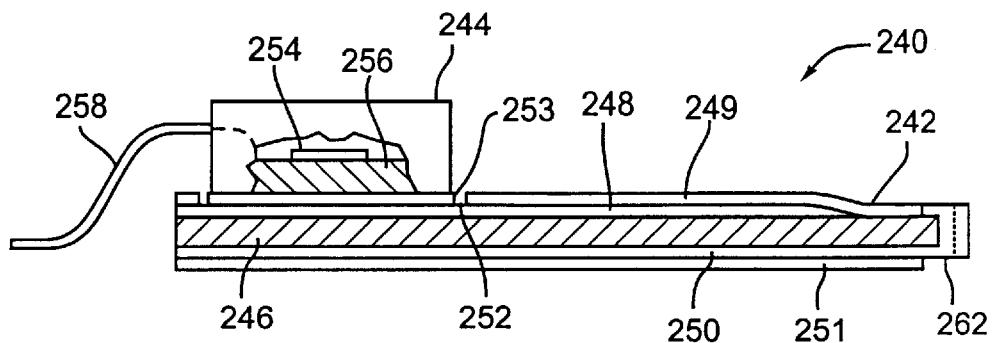
FIG. 45 is a side view of a preferred three terminal protection device, including a MOSFET regulator thermally and electrically coupled to a PTC chip, partially cut-away to show an internal portjn of the regulator.
Figure 46:
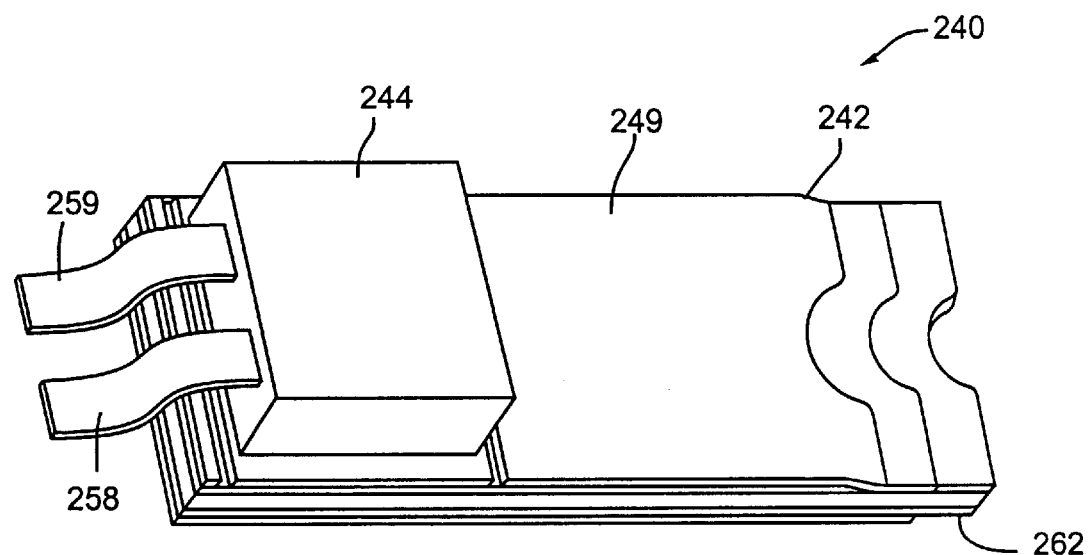
FIGS. 46–47 are respective top and bottom side perspective views of the device of FIG. 45.
Figure 47:
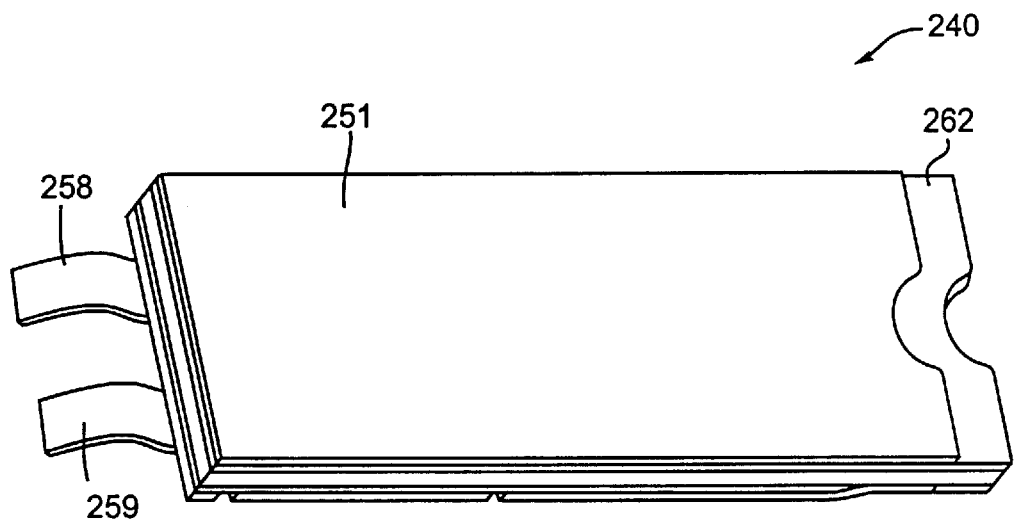

Referring to FIGS. 45–47, a preferred three terminal battery protection device 240 includes a PTC chip 242, which is thermally and electrically coupled to a MOSFET regulator 244.

The PTC chip 242 includes a layer of PTC material 246 having a first metal electrode layer 248 covering a first side, and a second metal electrode layer 250 covering a second (i.e., opposite) side. The metal electrode layers 248 and 250 are respectively coated with an insulating film 249 and 251. A portion of the insulating film 251 is missing at one end of the PTC chip 242, exposing a portion of the metal electrode layer 250, which forms a first terminal 262 of the protection package 240. A rectangular window 252 is provided in the insulating film 249 proximate the opposite end of the chip from first terminal 262, exposing a portion of the metal electrode layer 248 upon which the regulator 244 is attached by a solder bond 253.

In accordance with the protection circuit 69 of FIG. 20, the regulator 244 includes a MOSFET switch and precision control circuitry incorporated on a single silicon die 254. The die 254 is attached to heat sink 256, which is electrically coupled to the drain terminal of the MOSFET switch. The heat sink 256, in turn, is electrically and thermally coupled to the metal electrode layer 248 of the PTC chip 242 via the solder bond 253. The heat sink 256 is also electrically coupled to an external lead 258 extending away from the regulator 244 and over an end of the PTC chip 242 opposite electrode terminal 262. A source terminal of the MOSFET switch is electrically coupled to a second external lead 259 extending away from the regulator 244 adjacent to, and in the same manner as, lead 258. Leads 258 and 259 form respective second and third terminals of the protection device 240.

When the protection device is employed with a rechargeable battery (not shown), the first terminal 262 is coupled to the positive terminal of a battery charging device or discharging load device. The second terminal 258 is coupled to the positive terminal of the battery, and the third terminal 259 is coupled to the both the negative terminal of the battery pack and the negative terminal of a battery charging device or discharging load device. With this arrangement, an electrical path is formed from the first terminal 262 to the second terminal 258 of the package 240 via the metal electrode layer 250, PTC material 246, metal electrode layer 248, solder bond 253, and heat sink 256, respectively. If the MOSFET channel is activated (i.e., during an overvoltage condition), an electrical path is also formed from the first terminal 262 to the third terminal 259 via the metal electrode layer 250, PTC material 246, metal electrode layer 248, solder bond 253, heat sink 256, and MOSFET switch channel, respectively.

Attachment of the regulators 244 to the metal electrode 248 of the PTC chip 242 for assembly of device 240 may be readily incorporated into a known process for manufacturing the PTC chips 242. In particular, PTC material 246 is composed according to the desired performance characteristics, e.g., conductivity, tripping termpature, etc., and then formed into a sheet of a desired thickness depending, again, on the desired performance characteristics, e.g., thermal mass. The metal electrode layers 248 and 250 are provided as thin foil sheets of, e.g., nickel, copper or an alloy, which are pressed onto respective top and bottom surfaces of the sheet of PTC material 246. The insulating film layers 249 and 250 are silk screened over the respective metal layers 248 and 250. The layer is selectively photo-masked, and then exposed to light. The unexposed material masking material is then removed to expose portions of the metal layers to be used as respective electrode terminals for the PTC chips 242.

The sheets are then cut into multiple PTC chips 242 of selected dimensions. More specific details of preferred PTC device manufacturing processes and methods are disclosed in U.S. Pat. Nos. 5,852,397 and 5,831,150, which are fully incorporated herein by reference for all that they teach.

Figure 48:
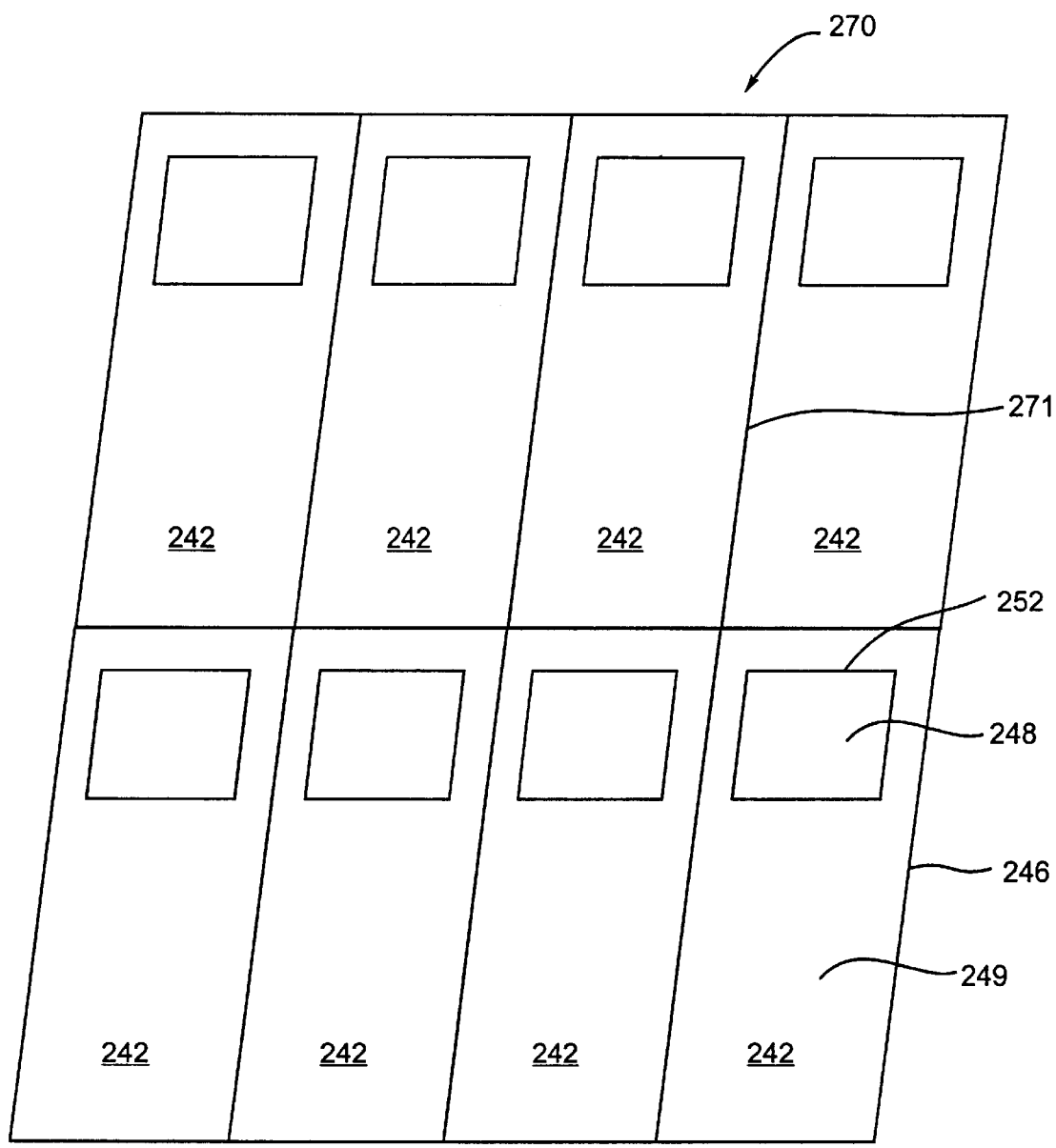
FIG. 48 is a perspective view of a sheet of PTC material sectioned for cutting into a plurality of PTC devices during assembly of the device of FIG. 45.

As part of the masking step in the above-described manufacturing process, the windows 252 in the insulating film layer 249 may be formed in the respective PTC chips 242 in any suitable shape. By way of example, FIG. 48 shows a sheet 270 of the PTC material 246 at the point where the metal electrode layer 248 and insulating film 249 have been applied. A pattern 271 is shown in sheet 270 for demarcation of the respective individual chips 242. Windows 252 are formed in the insulating film 249 of each PTC chip 242 to expose a portion of the metal electrode layer 248. The windows 252 are, in effect, respective pad locations for mounting the regulator devices 244.

Towards this end, solder material 253 is deposited onto the exposed metal electrode layer 248 in each window 252 and the respective heat sinks 256 of the regulator devices 240 are placed on the solder material 253. The PTC sheet 270 is then exposed to sufficient heat to re-flow the solder material 253. The windows 252 are preferably sized so that, during the re-flow process, the respective heat sinks 256 will "self center" within the window 252. Once the re-flow process in accomplished, the individual devices 240 are cut from the sheet 270 along lines 271. As will be apparent to those skilled in the art, the above-listed order of manufacturing steps is but one possible approach, and other sequences may be alternately employed without departing from the inventive concepts taught herein. By way of example, it may be desirable to cut the individual regulator devices 240 from the sheet prior to performing the solder re-flow.

Figure 50:
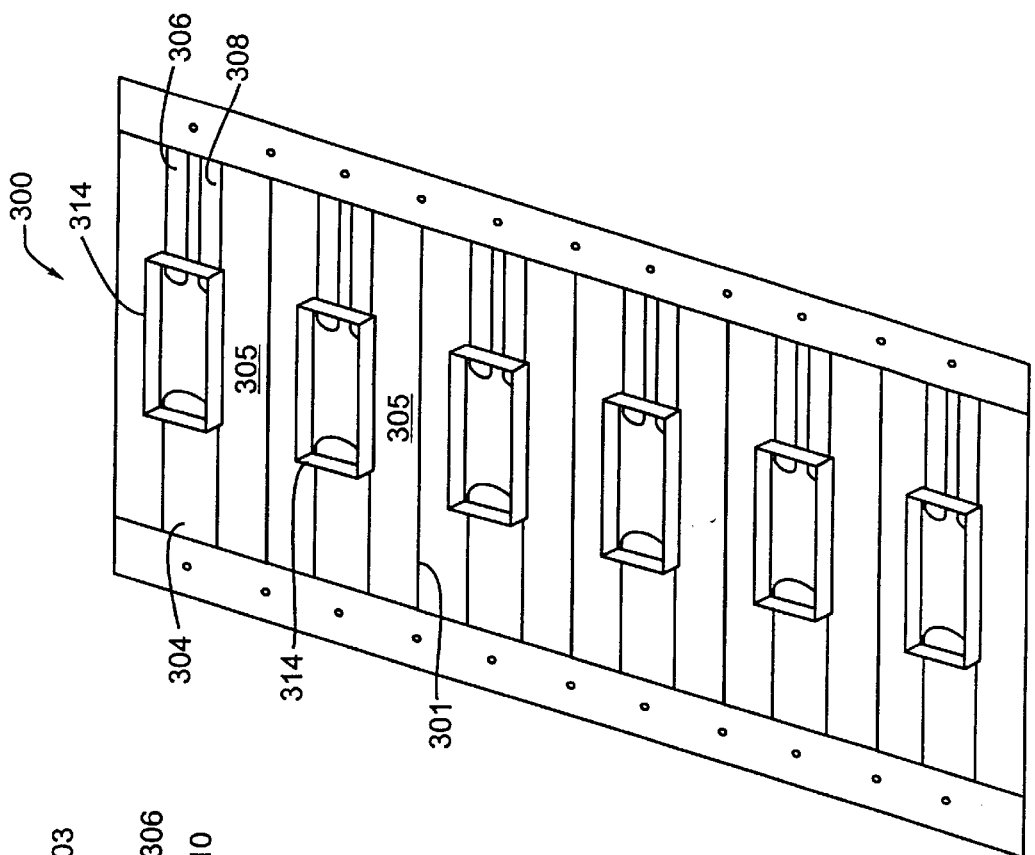
FIG. 50 is a perspective view of a plurality of molded housings formed on the lead frame of FIG. 49.
Figure 49:
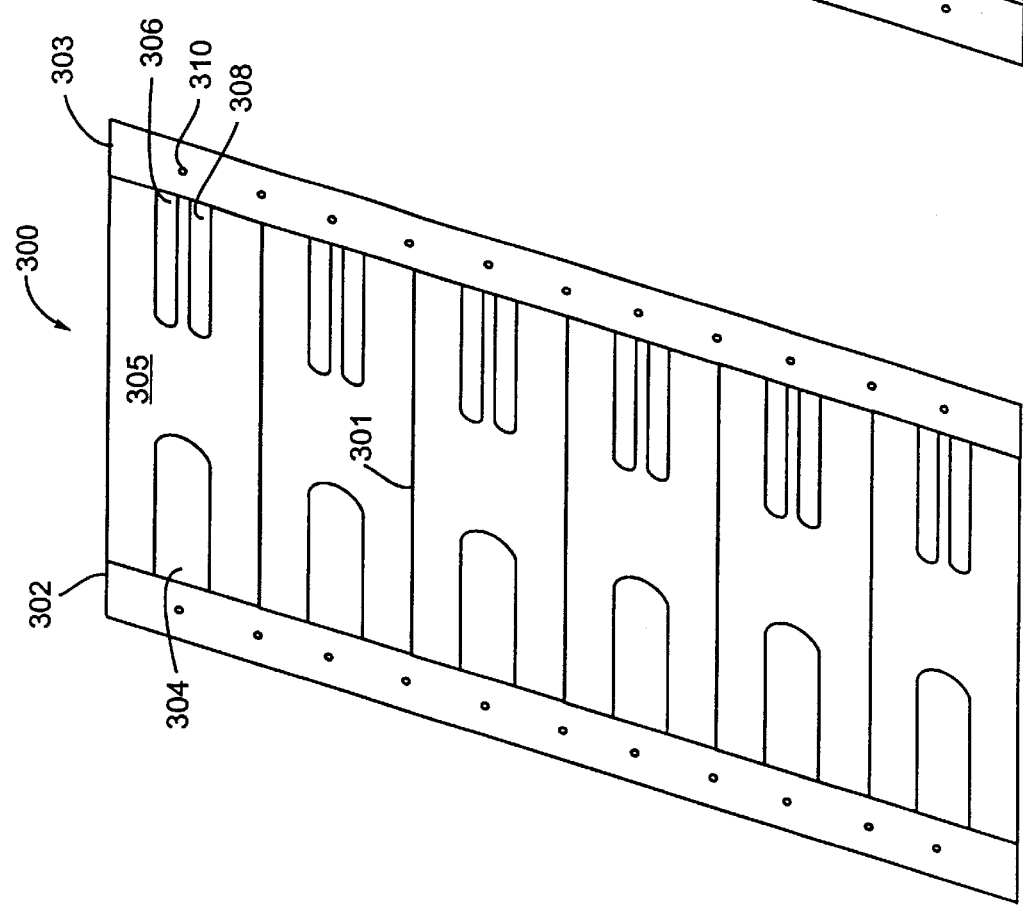
FIG. 49 is a perspective view of a preferred lead frame for use in the manufacture of injection molded housings for the three terminal device of FIG. 45.

Referring to FIGS. 49 and 50, a preferred process for manufacturing housings for the three terminal devices 240 by employing an injection molding process is as follows:

A lead frame 300 made from a flexible, conductive metal, such as e.g., copper, nickel or aluminum, comprises a pair of parallel frame edges 302 and 303 that are configured to be advanced into an injection molding machine (not shown). Speced holes 310 are provided along the frame edges for alignment (or registration( of the lead frame 300. The respective frame edges 302 and 303 are separated by spaced cross support members 301, which serve to both evenly space the frame edges 302 and 303, and to divide the lead frame 300 into evenly spaced, repeating sections 305.

A first tab 304, preferably made of the same flexible metal as the lead frame 300, extends from the frame edge 302 into each section 305. Likewise, second and third tabs 306 and 308, also preferably made of the same flexible metal as the lead frame 300, extend substantially parallel to one another from the frame edge 303 into each section 305. In particular, the respective tabs 304, 306 and 308 are configured in a pattern to allow for bulk assembly of injected molded housings 314 for the three terminal protection devices 240.

The tabs 304, 306 and 308 are preferably resilient and bendable to form electrical terminals of various sizes and configurations.

As seen in FIG. 50, a device housing 314 is formed around the tabs 304, 306 and 308 in each section 305 of the lead frame 300, wherein a distal portin of each tab 304, 306 and 308 is exposed inside the housing 314. In accordance with known injection molding techniques, a plurality of device housings 314 may be simultaneously formed. Prior to the injection process, and distal ends of tabs 304, 306 and 308 may be crimped or bent to best position the respective ends for making electrical contact with a device 240 placed into the finished housing 314. Such bending or crimping may also serve to add strength to the end walls of the housing 314.

Figure 51:
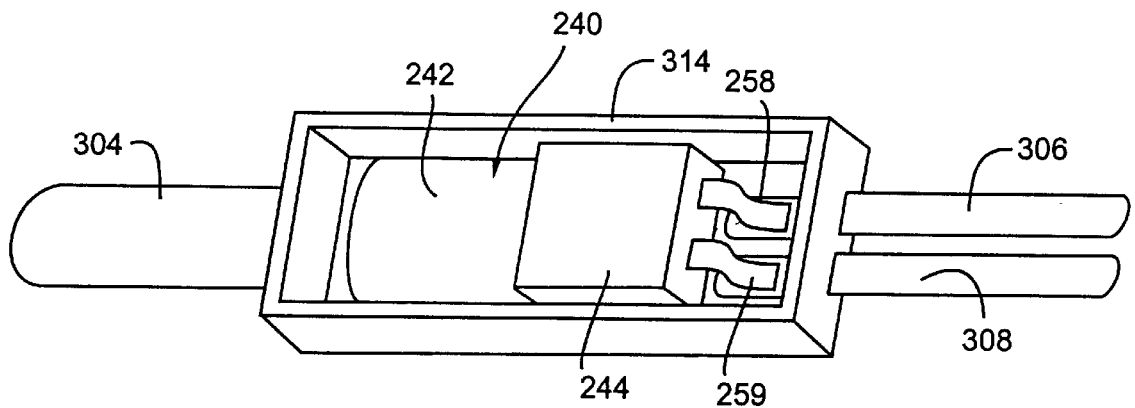
FIG. 51 is a perspective view of the three terminal device of FIG. 45 seated in a housing formed in accordce with the process depicted in FIGS. 49–50, without a cover.

Referring to FIG. 51, once the housings 314 have sufficiently solidfied, the respective frame edges 302 and 303, and cross-support members 301 are removed, and an assembled three terminal device 240 is placed into each housing 314. In particular, the devices 240 are placed into the housings 314 such that the first, second and third terminals 262, 258 and 259 make electrical contact with the exposed distal ends of tabs 304, 306 and 308, respectively. Altrernatively, PTC chip 242 and regulator device 244 can be placed into each housing 314 to obtain the same functionality. The terminals 262, 258 and 259 may be bonded (e.g., by a solder bond) to the respective tabs 304, 306 and 308, or mechanical contact may be relied on. If mechanical contact is relied on for the respective electrical connections, however, tabs 304, 306 and 308 should be sufficiently resilient to provide an internal spring force biased against the respective terminals 262, 258 and 259.

Figure 52:
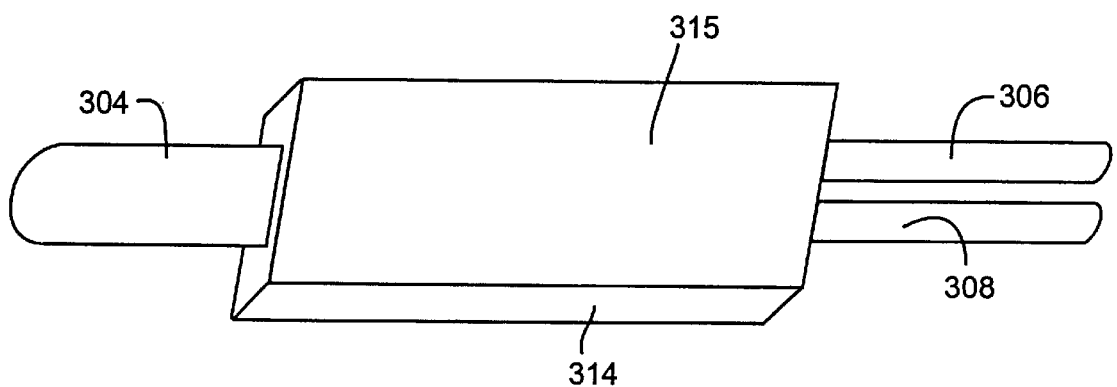
FIG. 52 is a perspective view of the three terminal device of FIG. 45 seated in a housing formed in accoylance with the process depicted in FIGS. 49–50, with a cover.

As seen in FIG. 52, a non-electrically conductive cover 315 is then nolded, or otherwise bonded, over the opening of the housing 314, to both secure and isolate the device 240. The housings 314 are preferably sized so as to snuggly accommodate the devices 240. Importantly, however, the housings must not be too confining, or otherwise exert compressive force on the device 240, as the PTC chips 242 must be allowed to expand (e.g., up to approximately 10%) when heated in order to operate corretly.

Once the device 240 is sealed in a respective housing 314, the tabs 304, 306 and 308 become the respective leads—i.e., with tab 304 configured for coupling to the positive terminal of a battery charging device or discharging load device; tab 306 configured for coupling to the positive terminal of a battery; and tab 308 configured for coupling to both the negative terminal of the battery and the negative terminal of the respective charging device or discharging load device. The flexibility of the tabs 304, 306 and 308 provides for ease in attachment to the respective positive and negative battery terminals (e.g., by a spot weld), as well as to electrical connectors for attaching to a charging device or discharging load.

In alternate embodiments, the devices 240 can be potted, rather than placed, in the housings 314. Depending on the desired performance characteristics, the selected potting material be either thermally conductive or thermally insulating.

As will be apparent to those skilled in the art, the injection molded housings 314 can be alternately formed from various non-electrically conductive materials such as plastics or ceramics. The characteristics of the selected material, as well as the housing dimensions ( i.e., thickness) should be selected based on such factors as cost, availability, "moldability" (i.e., how rapidly the material solidifies after being injected), strength and thermal conductivity, among other factors. Such design considerations also include device installation requirements and reworking requirements. It is important, however, that the housing material not materially interfere with the trip characteristics of the PTC chip 242 of the devices 240.

In particular, as discussed above, the trip time is the amount of time it takes for a device to switch to a high-resistance state once a fault condition has been applied through the device. If the packaging material has a thermal conductivity that is too low, the PTC device 242 may over heat under normal operating conditions, causing undesired ("nuisance") tripping to cocur. On the other hand, if the packaging material is made from material having thermal conductivity that is too high, the PTC device 242 may trip too slowly in an overvoltage, or overcurrent condition.

The selection of the housing material and dimensions should also take into account the expected applicaiton or environment in which the device 240 will be operating. Design considerations typically include expected voltage and current operating conditions, surge current ratings, maximum internal battery pack operating temperature during normal charge/discharge, and the ragne of expected ambient operating temperatures.

One general advantage of the three terminal devices 240 is that they can be thermally coupled to a battery pack to thereby also provide overtemperature protection. If the devices 240 are placed in the housings 314, then the ability to achieve a thermal heat path from the battery pack to the device 240 must also be taken into account.

Figure 53:
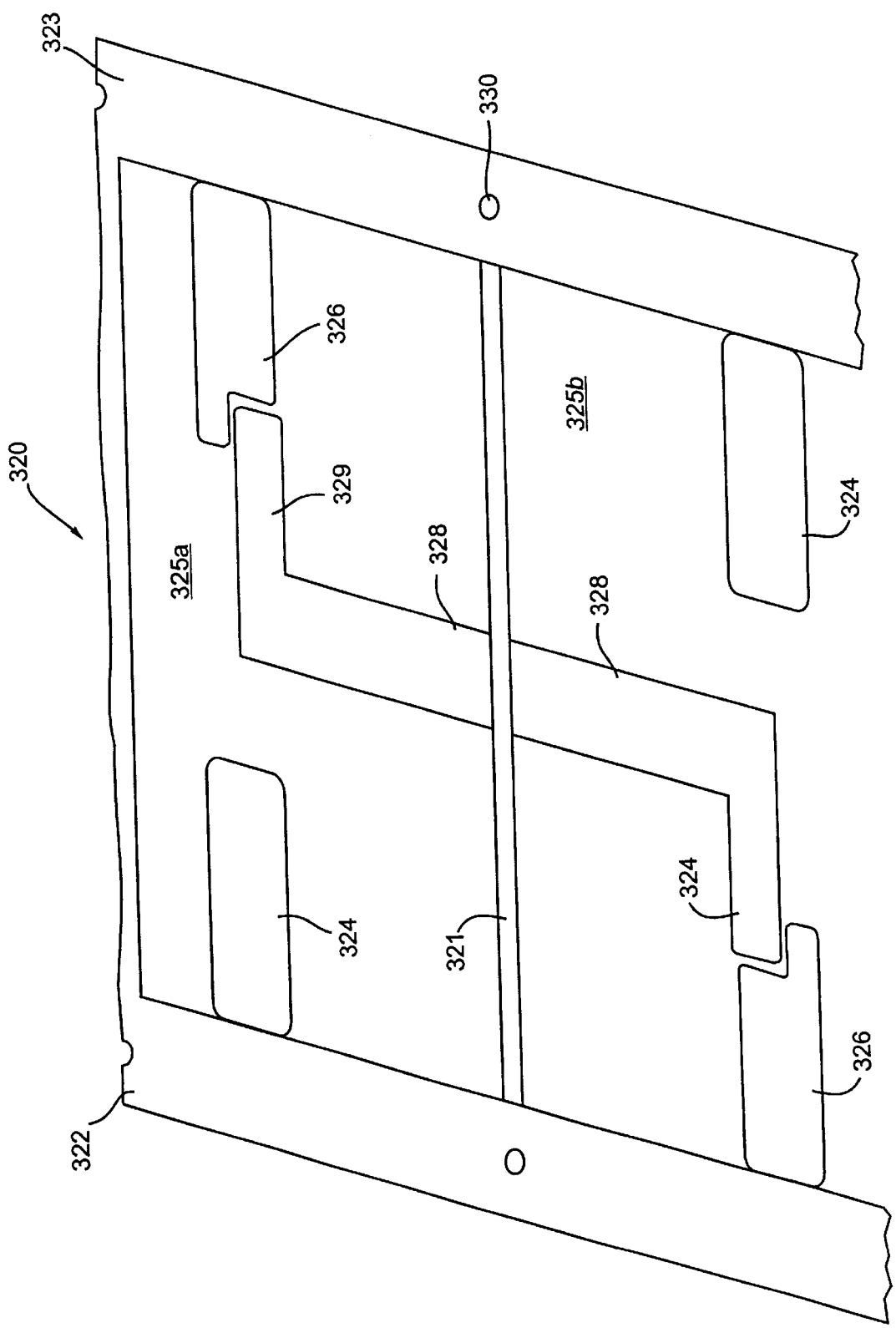
FIG. 53 is a perspective view of a first alternate preferred lead frame for use in the manufacture of ection molded housings for the three terminal device of device of FIG. 45.
Figure 54:
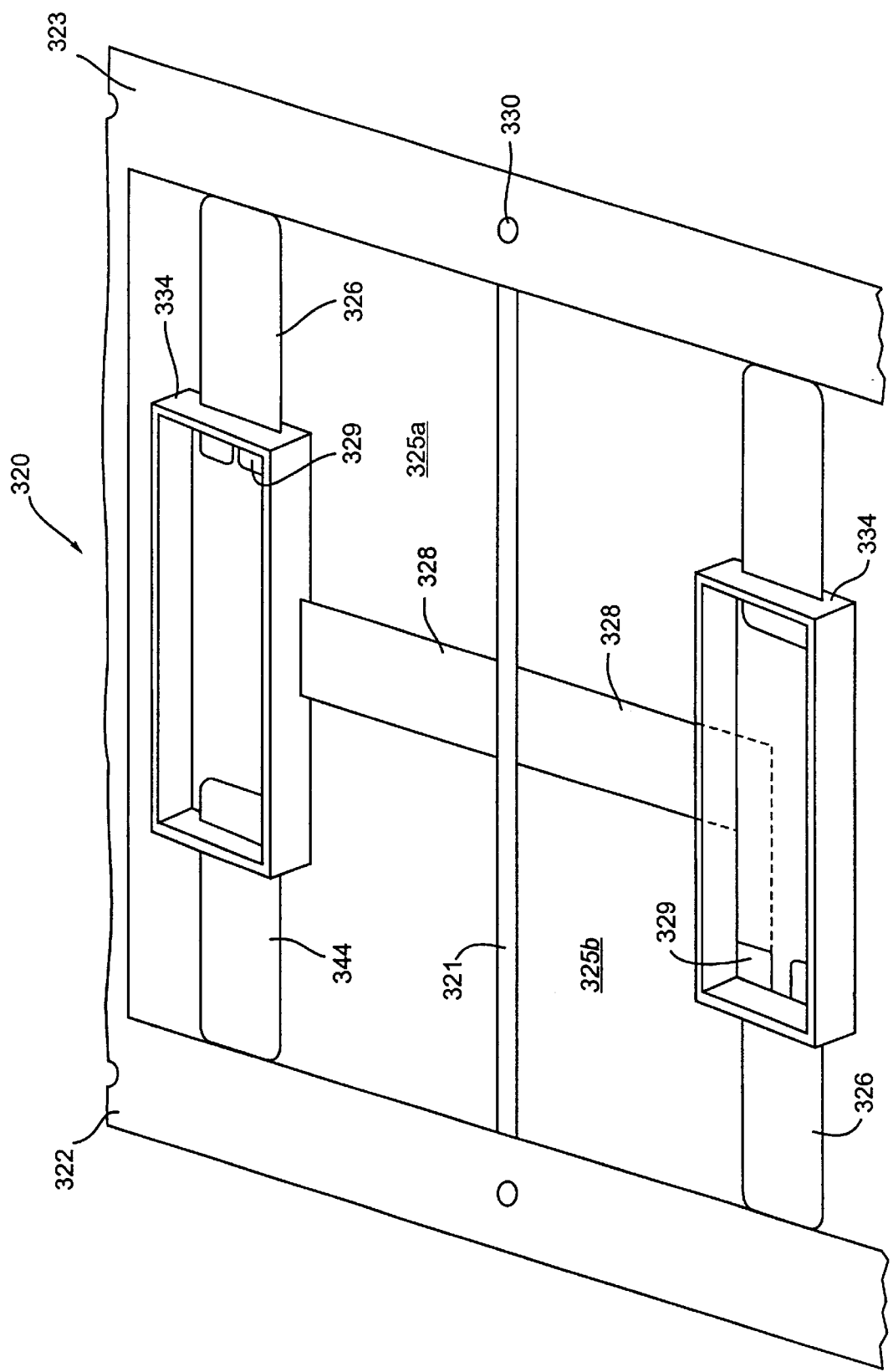
FIG. 54 is a perspective view of a plurality of molded housings formed on the lead frame of FIG. 53.
Figure 55:
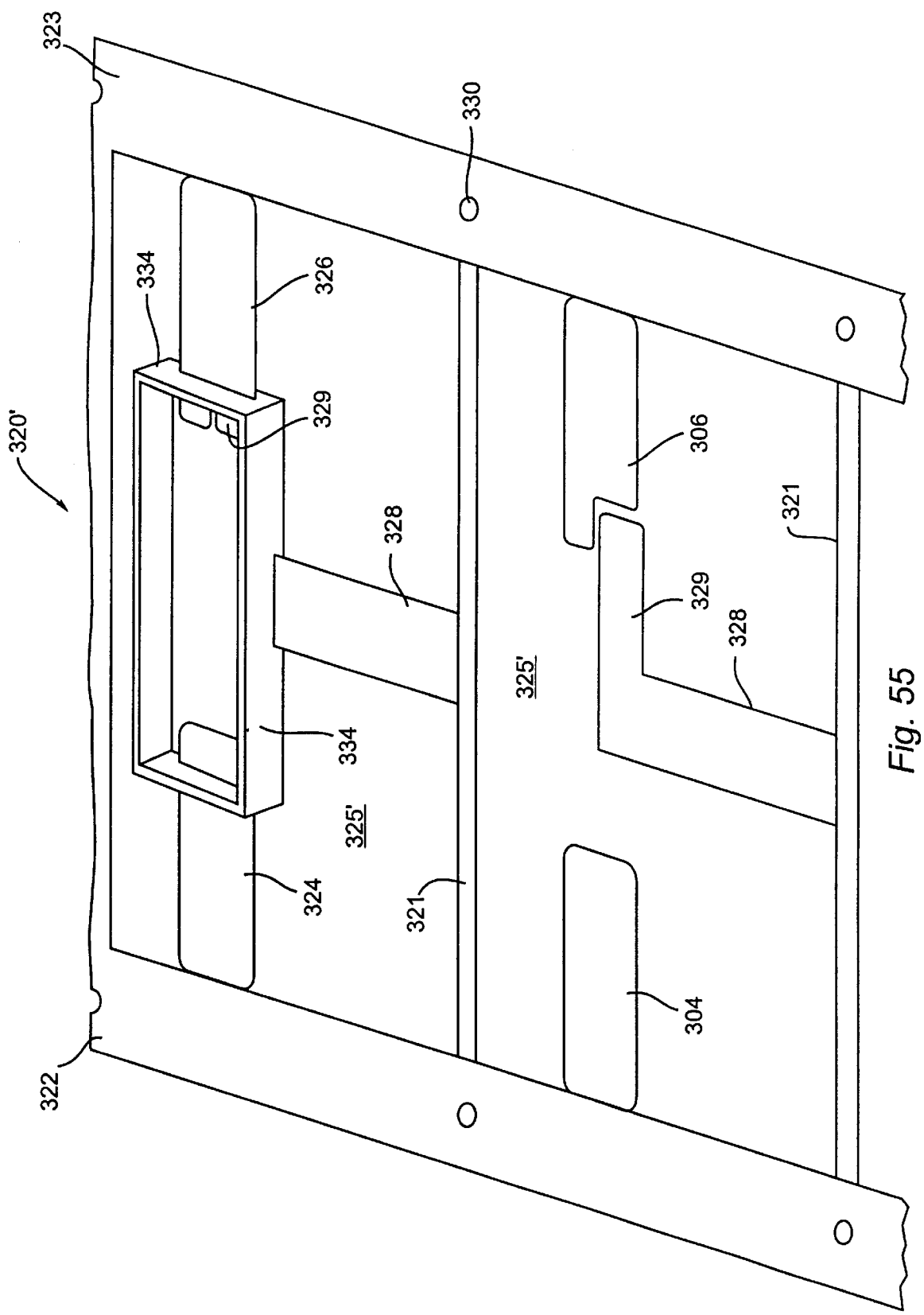
FIG. 55 is a perspective view of a second alternate preferred lead frame for use in the manufacture of injection molded housings for the three terminal device of device of FIG. 45.

FIGS. 53–55 depict alternative lead frame configurations 320 and 320' for use in the above-described process for manufacturing housings for the three terminal devices 240 by an injection molding process.

Referring in particular to FIG. 53, as with lead frame 300, lead frame 320 is preferably made from a flexible, conductive metal, such as, e.g., copper or aluminum. Frame 320 copmprises a pair of parallel frame edges 322 and 323 that are configured to be advance into an injection molding machine (not shown), via the advancement holes 330. The respective frame edges 322 and 323 are separated by evenly spaced cross support members 321, which serve to both evely space the frame edges 322 and 323, and to divide the lead frame 320 into evenly spaced, alternating sdections 325a and 325 b. In particular, sections 325a and 325 b are mirror images of each.

In section 325a, a first conductive tab 324 extends from frame edge 322, a second conductive tab 326 extends from frame edge 323, and a third conductive tab 328 extends from the cross support member 321, respectively, In section 325b, tab 324 extends from frame edge 323, tab 326 extends from frame edge 322. Notably, the conductive tab 328 still extends from the cross support member 321. In particular, in lead frame 320, every other cross support member 321 attaches to the respective tabs 328 for the adjacent sections 325a and 325b, with the remaining every other cross support members 321 having no attachments.

Referring also to FIG. 55, in a second alternate preferred lead frame 320', the respective sections 325' are not mirror image, but repeat consectively, In other words, lead frame 320' is exactly like lead frame 320, except that every cross support member 321' supports tab 328 for a single adjacent section 325'.

As with tabs 304, 306 and 308 on lead frame 300, tabs 324, 326 and 328 are preferably made of the same flexible metal as the lead frame 320. In particular, the respective tabs 304, 306 and 308 are configured in a pattern to allow for bulk assembly of injected molded housings for the three terminal protection devices 240. The tabs 324, 326 and 328 are preferably resilient and bendable to form electrical terminals of various sizes and configurations.

As seen in FIGS. 54 and 55, a device housing 334 is formed around the tabs 324, 326 and 328 in each section 325a and 325b of the lead frame 320, wherein distal portinos of tabs 324, 326 and 328 are exposed inside the housing 334. Prior to the injection process, the distal ends of tabs 324, 326 and 328 may be crimped or bent to best position the respective ends for making electrical contact with a device 240 placed into the finished housing 334. In particular, a distal portion 329 of tab 328 is crimped such that the "bottom" wall of the molded housing 334 encases and, thus, electrically isolates, all except a very end portion (shown in phantom in FIGS. 54 and 56). As with housing 314, such bending or crimping may also serve to add strength to the respective end and bottom walls of the housing 334.

Figure 56:
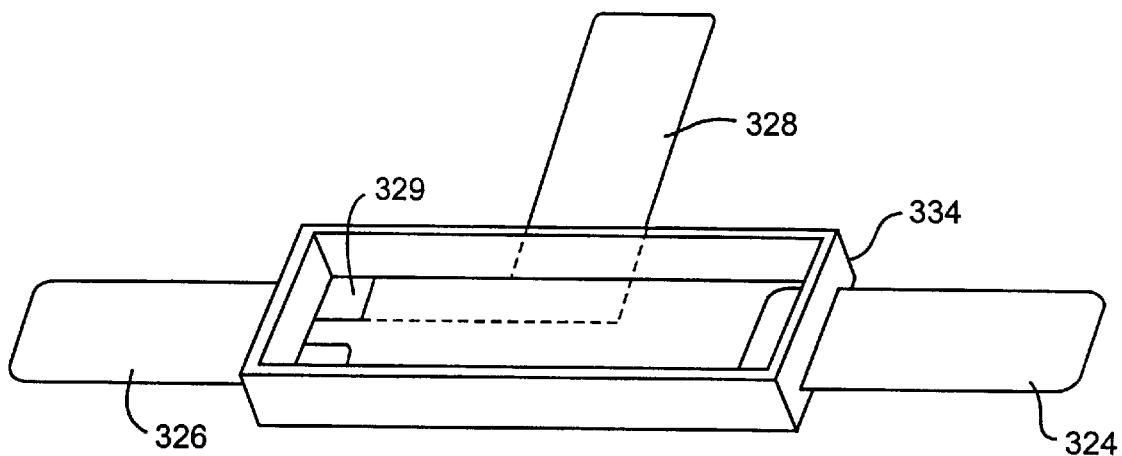
FIG. 56 is a perspective view of the three terminal device of FIG. 45 seated in a housing formed in accordance with the process depicted in FIGS. 54 or 55.

Notably, the completed housing 334 is identical, regardless of whether lead frame 320 or 320' is used. A completed housing 334, i.e., with the respective frame edges 322 and 323 and cross-support members 321 removed, is illustrated in FIG. 56. As will be appreaciated by those skilled in the art, the difference between housing 334 and housing 314 is that the tab lead 328 coupled to the ground (or negative) terminal 259 of device 240 extends from a side of the housing 334, instead of from an end. This alternate housing configuration allows for flexibility in ways the three terminal device 240 can be attached to a rechargeable battery pack.

Figure 57:
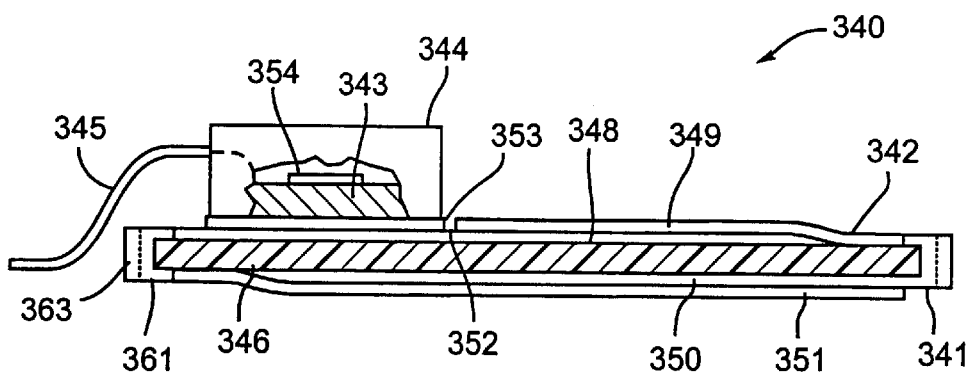
FIG. 57 is a side view of an alternate embodiment of the preferred three terminal protection of FIG. 45.
Figure 58:
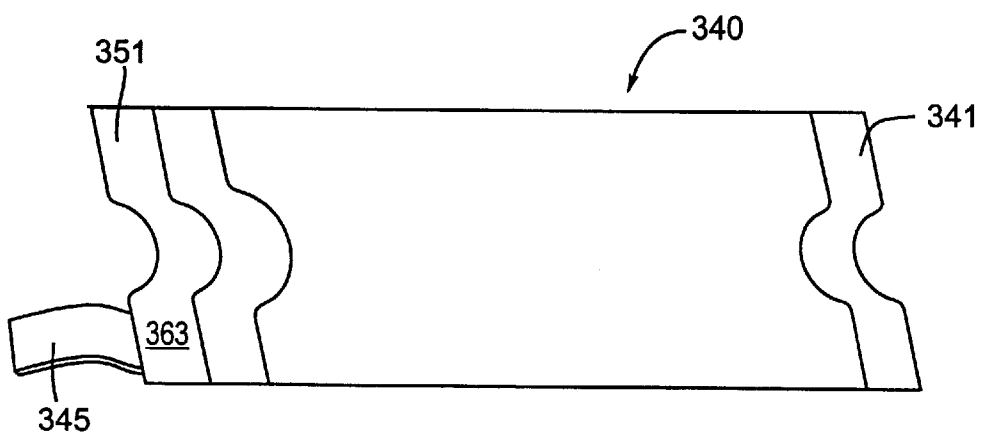
FIG. 58 is a bottom side perspective view of the device of FIG. 57.
Figure 59:
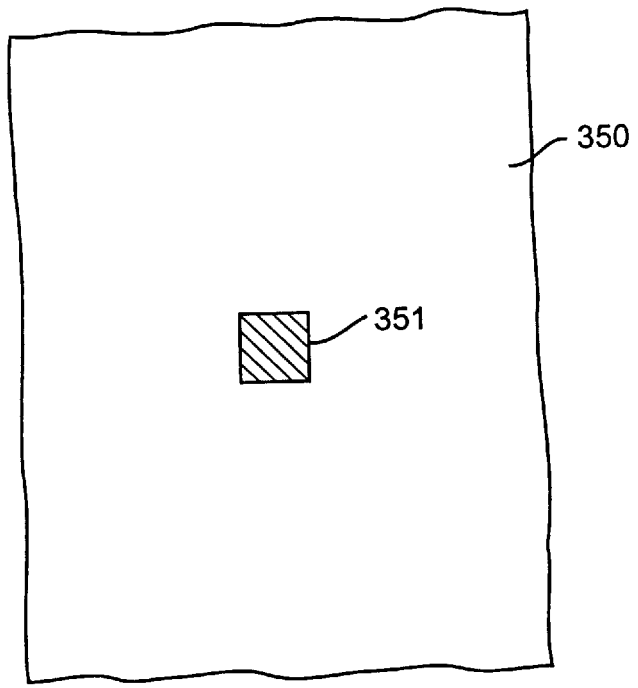
FIG. 59 is an elevated perspective view of a portion of a flexible printed circuit board ("pc board") configured with an opening for mounting an alternate preferred three terminal protection circuit to a rechargeable battery pack.
Figure 60:
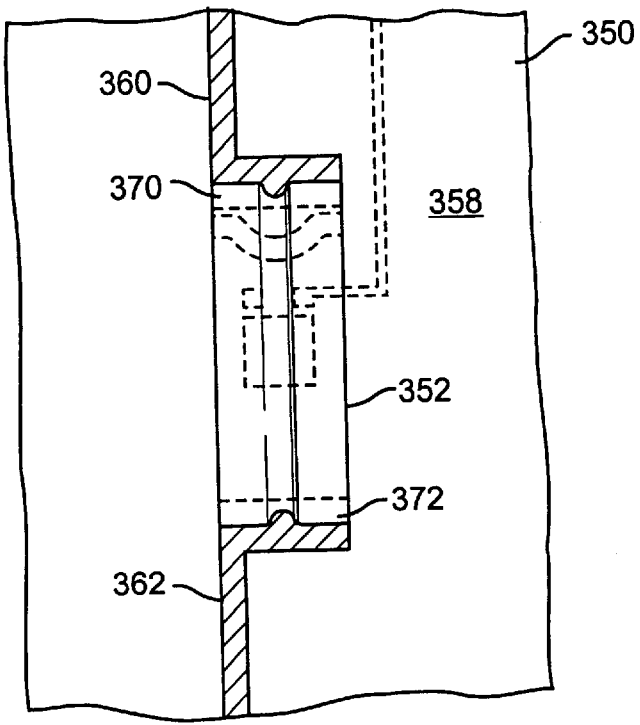
FIG. 60 is an elevated perspective of the flexible pc board of FIG. 59, depicting a MOSFET regulator device mounted, through the opening, to a PTC device secured to an underlying side of the pc board.
Figure 61:
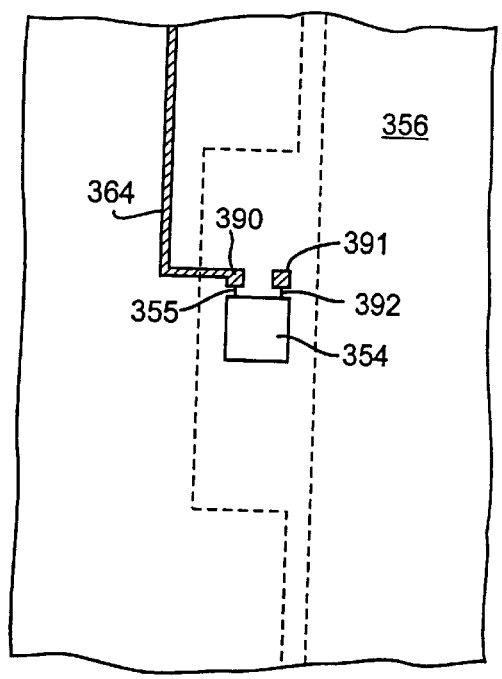
FIG. 61 is an elevated perspective of the underlying side of the pc board of FIG. 59.

FIGS. 57–58 depict an alternate preferred embodiment 340 of the above-described three terminal protection device 240. Like protection device 240, protection device 340 includes a PTC chip 342, which is thermally and electrically couple to a MOSFET regulator 344. The PTC chip 342 includes a layer of PTC material 346 having a first metal electrode layer 348 covering a first side, and a second metal electrode layer 350 covering a second (i.e., opposite) side. The metal electrode layers 348 and 350 are respectively coated with an insulating film 349 and 351.

As in device 240, a portion of the insulating film 351 is missing at one end of the PTC chip 342, exposing a portin of the metal electrode layer 350, which forms a first terminal 341 of the protection package 340. Unlike in device 240, a portion of the insulating film 351 is also missing at the other end of the PTC chip 342, exposing a portion of a via 363 of metal electrode layer 348, which forms a second terminal 361 of device 340. A rectangular window 352 is provided in the insulating film 349 proximate the same end of the chip as the second terminal 361, exposing a portion of the metal electrode layer 348 upon which the regulator 344 is attached by a solder bond 353.

Like regulator 244 in devcie 240, regulator 344 includes a MOSFET switch and precision control circuitry incorporated on a single silicon die 354. The die 354 is attached to a heat sink 343, which is electrically coupled to the drain terminal of the MOSFET switch. The heat sink 343, in turn, is electrically and thermally coupled to the metal electrode layer 348 of the PTC chip 342 via the solder bond 353. A source terminal of the MOSFET switch is electrically coupled to an external lead 345 extending away from the regulator 344, the external lead 345 forming a third terminal of protection device 340.

When the protection device 340 employed with a rechargeable battery pack (not shown), the first terminal 341 is coupled to the positive terminal of a battery charging device or discharging load device. The second terminal 361 is coupled to the positive terminal of the battery and the third terminal 345 is coupled to the bother the negative terminal of the battery and the negative terminal of a battery charging device or discharging load device. With this arrangement, an electrical path is formed from the first terminal 341 to the second terminal 361 via the metal electrode layer 350, PTC material 346 and metal electrode layer 348. If the MOSFET channel is activated (i.e., during an overvoltage condition), an electrical path is also formed from the first terminal 341 to the third terminal 345 via ther metal electrode layer 350, PTC material 346, metal electrode layer 348, sodler bond 353, heat sink 343, and MOSFET switch channel, respectively.

Referring to FIGS. 59–62, in accordance with yet another aspect of the inventions provided herein, a flexible printed circuit board ("pc board") 350 is provided with an aperture 351 for attaching a MOSFET regulator 354 mounted on a first side 356 of the pc board 350 to a PTC chip 352 mounted to a second (underlying) side 358 of the pc board 350.

Figure 62:
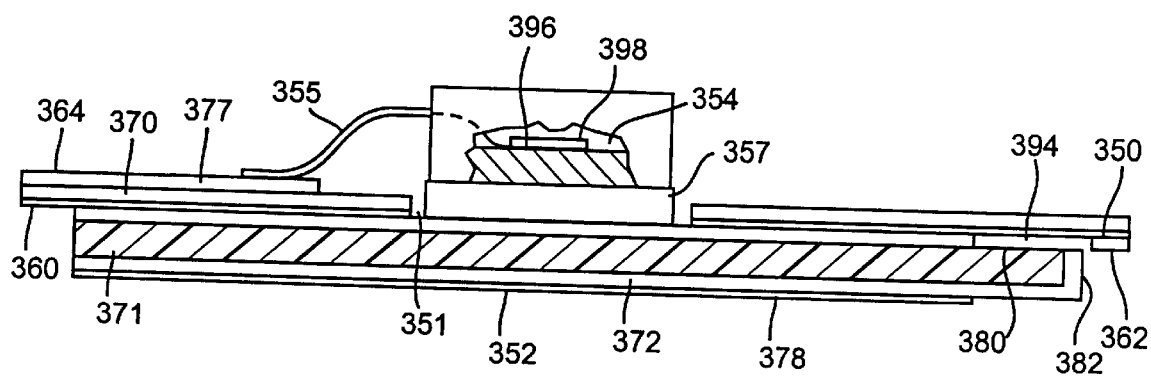
FIG. 62 is a partially cut-away side view of the pc board of FIG. 61.

As best seen in FIG. 62, the PTC chip includes a layer of PTC material 371 having a first metal electrode layer 370 covering a first side, and a second metal electrode layer 372 covering a second (i.e., opposite) side of the PTC layer 371. The metal electrode layers 370 and 372 are coated with respective insluating film layers 377 and 378. A portion of the insulating film 377 underlying the aperture 351 is missing to expose a portion of metal electrode layer 370 upon which a heat sink 396 of the regulator 354 is attached by a solder bond 357.

A further portion of insulating layer 377 is removed proximate one end of the PTC chip 352, exposing a further portion of the metal electrode layer 370, which is bonded to a first conductive lead 360 on pc board surface 358. At the opposite end of the PTC ship 352, a metal path 382 couples metal electrode layer 372 to a small electrode area 394 on the same side as metal layer 370. A gap 380 electrically isolates electrode area 394 from metal layer 370. The electrode area 394 is bonded to a second conductive lead 362 on pc board surface 358. In this manner, the PTC chip 352 is anchored to the pc board surface 358 by the bond of electrode 370 to surface lead 360 at one end, and the bode of electrode 394 to surface lead 362 at the other end.

The regulator is secured to the first side 356 of the pc board 350 by first and second leads 355 and 392. In particular, lead 355 is bonded to a first bond pad 390, and lead 358 is bonded to a second bond pad 391, respectively, on pc board side 356. Bond pad 390 is electrically coupled to a third conductive lead 364 on the pc board surface 356. In this manner, the regulator device is secured to the pc board surface 356 by both the bonded leads 355 and 392, as well as the solder bond 357 between the heat sink 396 to the PTC chip 352. Notably, lead 355 is also coupled to the source terminal of the MOSFET switch 398.

When attached to a rechargeable battery pack (not shown), pc board lead 362 is configured for coupling to the positive terminal of a battery charging device or discharging load device; pc board lead 360 is configured for coupling to the positive terminal of the battery; and pc board lead 364 is configured for coupling to both the negative terminal of the battery and the negative terminal of a battery charging device or discharging load device. An electrical path is formed from lead 362 to the second terminal lead 360, via the metal electrode layer 372, PTC material 371, and metal electrode layer 370, respectively, If the MOSFET channel is activated (i.e., during an overvoltage condition), an electrical path is also formed from lead 362 to lead 364 via the metal electrode layer 372, PTC material 371, metal electrode layer 370, solder bond 357, heat sink 396, MOSFET switch channel and source terminal 398, and lead 355, respectively.

One advantage of the embodiment of FIGS. 59–62 is that the PTC chip 352 is readily mounted directly to the battery pack casing, allowing the PTC chip 352 to provide protection of the battery pack from an overtemperature condition (i.e., through conductive heating from the battery pack casing).

While preferred circuits, devices and methods for providing overvoltage, overcurrent and/or overtemperature protection to rechargeable elements have been shown and described, as would be apparent to thos eskilled in the art, many modifications and applications are possible without departing from the inventive concepts herein.

By way of example, while the forgoing described preferred embodiments are directed mainly to three-terminal device embodiments, it will be readily apparent to those skilled in the art that the inventions disclosed herein may also be embodied in multiple different-numbered terminal and pin geometries.

Further, while the forgoing preferred embodiments are generally directed to protection circuits and systems, the inventive concepts may also be employed as voltage regulator circuits, e.g., as part of a battery charger system. As will be appreciated by those skilled in the art, the PTC devices employed in the above described protection circuits would necessarily need to be tuned for frequent temperature tripping and resetting in a voltage regulator application.

What is claimed is:

1. A protection circuit for use with a charger and a chargeable element, comprising:
    a shunt regulator having first and second terminals for coupling in parallel across the chargeable element, the shunt regulator having a threshold ON voltage; and
    a first variable resistor thermally and electrically coupled to the shunt regulator, the first variable resistor having a first terminal for coupling to the charger in series and a second terminal for coupling to the chargeable element in series,
    wherein the first variable resistor limits current flowing through the shunt regulator during an overvoltage or overcurrent condition before the current reaches a level sufficient to cause the shunt regulator to fail.

2. The protectino circuit of claim 1, wherein the first variable resistor switches from a relatively low resistance to a relatively high resistance when heated to a certain transition temperature, and wherein current flowing through the shunt regulator at the predetermined level causes ohmic heat generation in the shunt regulator to cause the first variable resistor to substantially reach its transition temperature.

3. The protection circuit of claim 1, wherein the first variable resistor comprises a positive temperature coefficient device.

4. The protection circuit of claim 1, wherein the shunt regulator comprises a transistor switch.

5. The protection circuit of claim 4, wherein the shunt regulator further comprises control circuitry configured to activate the transistor switch if the voltage across the chargeable element reaches the threshold ON voltage.

6. The protection circuit of claim 5, wherein the control circuitry comprises first and second voltage detection circuits, the first voltage detection circuit being relatively low leakage and the second voltage detection circuit being relatively precise, wherein the first voltage detection circuit is configured to activate the second voltage detection circuit if the voltage across the chargeable element approaches the threshold ON voltage, and wherein the second voltage detection circuit is configured to activate the transistor switch if the voltage across the chargeable element reaches the threshold ON voltage.

7. The protection circuit of claim 5, wherein the control circuitry comprises an operational amplifier having an output coupled to an activation gate of the transistor switch, and further comprising a voltage clamping element coupled to the operational amplifier output, the clamping element thereby clamping the activation gate voltage.

8. The protection circuit of claim 7, wherein the clamping element comprises a zener diode.

9. The protection circuit of claim 4, wherein the transistor switch has a thermally-compensated voltage characteristic.

10. The protection circuit of claim 1, further comprising undervoltage protection circuit.

11. The protection circuit of claim 10, wherein the undervoltage protection circuit comprises a transistor switch having a threshold ON voltage, and having source and drain terminals configured for coupling in series between the charger and the cargeable element.

12. The protection circuit of claim 11, wherein the undervoltage protection circuit further comprises control circuitry configured to turn the transistor switch ON if the voltage across the chargeable element is at or greater than a selected minimum voltage, and to turn the transistor switch OFF if the voltage across the chargeable element falls below the selected minimum voltage.

13. The protection circuit of claim 1, wherein the shunt regulator comprises a MOSFET switch having a relatively high resistance, reverse-current body diode.

14. The protection circuit of claim 1, wherein the shunt regulator comprises a transistor switch having a channel through which current may flow in a forward direction if positive-biased, or a reverse direction if negative-biased, the switch being constructed such that current flowing in the forward direction encounters relatively low resistance, and current flowing in the reverse direction encounters relatively high resistance.

15. The protection circuit of claim 1, further comprising a seond variable resistor coupled in series with the shunt regulator.

16. In combination, a protection circuit and a chargeable element, comprising:
    a voltage regulator coupled in parallel to the chargeable element, the voltage regulator having a threshold ON voltage; and
    a variable resistor coupled in series to the chargeable element and electrically and thermally coupled to the voltage regulator,
    wherein the variable resistor limits current flowing through the voltage regulator during an overvoltage or overcurrent condition before the current reaches a level sufficient to cause the voltage regulator to fail.

17. The combination of claim 16, wherein the variable resistor switches from a relatively low resistance to a relatively high resistance when heated to a certain transition temperature, and wherein current flowing though the voltage regulator at the predetermined level causes sufficient ohmic heat generation in the voltage regulator to heat the variable resistor substantially to its transition temperature.

18. The combination of claim 16, wherein the variable resistor comprises a positive temperature coefficient device, and wherein the voltage regulator comprises a transistor switch device.

19. A protection circuit for use with a chargeable element, comprising:
    a smart circuit;
    a variable current-limiting element coupled in series to the smart circuit; and a voltage regulator having first and second terminals for coupling to the chargeable element, the voltage regulator having a selected threshold ON voltage.

20. The protection circuit of claim 19, wherein the current-limiting element is thermally coupled to the voltage regulator.

21. The protection circuit of claim 19, wherein the current-limiting element comprises at least one of a positive temperature coefficient device, a thermal fuse or a bimetallic breaker.

22. The protection circuit of claim 19, wherein the voltage regulator is one of a zener diode or a field effect transistor.

23. A protection system for use with a chargeable element, comprising:
   detection means for detecting an overcharging condition of the rechargeable element;
   shuntinng means, responsive to said detection means, for shunting the rechargeable element when the overcharging condition occurs; and
   protection means, responsive to the shunting means, for limiting current flowing in the rechargeable element when the shunting means shunts the rechargeable element.

24. The protection system of claim 23 wherein:
   the detection means includes a transmitting element of an opto-coupler and a voltage dependent resistive element having a threshold voltage not greater than a maximum operating voltage of the rechargeable element;
   the shunting means includes a receiving element of said opto-coupler; and
   if, during a charging operation, a current flowing in the voltage dependent resistive element reaches a predetermined level that would cause overcharging of the rechargeable element ot occur, the transmitting element is activated and causes the receiving element to shunt the rechargeable element, which in turn activates the protection means to limit current flowing in the rechargeable element.

25. The protection system of claim 24, wherein the protection means comprises a fuse and the voltage dependent resistive element comprises a zener diode.

26. The protection system of claim 24, wherein the protection means comprises a positive temperature coefficient (PTC) device and the voltage dependent resistive element comprises a zener diode.

27. The protection system of claim 23, wherein:
   the detection means includes overvoltage detection means for detecting an overvoltage condition;
   the shunting means includes a power MOSFET transistor activatable by the overvoltage detection means; and
   when the overvoltage detection means detects that the voltage of the rechargeable element reaches a predetermined level, during a charging operation, the overvoltage detection means activates the power MOSFET transistor to shunt the rechargeable element, thereby activating the protection means, which limits current flowing in the rechargeable element.

28. The protection system of claim 23, wherein:
   the detection means includes overvoltage detection means for detecting an overvoltage condition;
   the shunting means includes a thyristor, which can be activated by the overvoltage detection means;
   the protection means includes a fuse connected between a charger and the rechargeable element; and
   when the overvoltage detection means detects that the voltage of the rechargeable element reaches a predetermined level during a charging operation, the overvoltage detection means activates the thyristor to shunt the rechargeable element, thereby causing the fuse to blow to disconnect the charger from the rechargeable element.

29. The protection system of claim 28, wherein the protection means further includes a second fuse connected between the thyristor and the rechargeable element.

30. The protection system of claim 28, wherein each of the fuses has a predetermined delay upon shunting the rechargeable element before it blows.

31. A protection circuit for use with a charger and a chargeable element, comprising a shunt regulator having first and second terminals for coupling in parallel across the chargeable element, the shunt regulator comprising:
   a transistor switch having a threshold ON voltage; and
   control circuitry configured to activate the transistor switch if the voltage across the chargeable element reaches the threshold ON voltage, the control circuitry including first and second voltage detection circuits, the first voltage detection circuit being relatively low leakage and the second voltage detection circuit being relatively precise, wherein the first voltage detection circuit is configured to activate the second voltage detection circuit if the voltage across the chargeable element approaches the threshold ON voltage, and wherein the second voltage detection circuit is configured to activate the transistor switch if the voltage across the chargeable element reaches the threshold ON voltage.

32. A protection circuit for use with a charger and a chargeable element, comprising a shunt regulator having a first and second terminals for coupling in parallel across the chargeable element, the shunt regulator comprising:
   a transistor switch having a threshold ON voltage; and
   control circuitry configured to activate the transistor switch if the voltage across the chargeable element reaches the threshold ON voltage, the control circuitry including an operational amplifier having an output coupled to an activation gate of the transistor switch, and an voltage clamping element coupled to the operational amplifier output, the clamping element effectively clamping the activation gate voltage.

33. A protection circuit for use with a charger and a chargeable element, comprising a shunt regulator having first and second terminals for coupling in parallel across the chargeable element, the shunt regulator including a transistor switch having a thermally-compensated voltage characteristic.

34. A protection circuit for use with a charger and a chargeable element, comprising:
   an overvoltage shunt regulator having first and second terminals for coupling in parallel across the chargeable element, the shunt regulator comprising a first transistor switch having a threshold ON voltage approximating a selected maximum operating voltage of the chargeable element; and
   an undervoltage protection circuit having first and second terminals configured for coupling in series between the charger and the chargeable element, the undervoltage protection circuit comprising a second transistor switch having a threshold ON voltage approximating a selected minimum operating voltage of the chargeable element.

35. A protection circuit for use with a charger and a chargeable element, comprising an overvoltage shunt regulator having first and second terminals for coupling in parallel across the chargeable element, the shung regulator comprising a MOSFET switch having a threshold ON voltage approximating a selected maximum operating voltage of the chargeable element, and a relatively high resistance, reverse-current body diode.

36. A protection circuit for use with a charger and a chargeable element, comprising:
    a shunt regulator having first and second terminals for coupling in parallel across the chargeable element, the shunt regulator having a threshold ON voltage;
    a first positive temperature coefficient (PTC) device thermally and electrically coupled to the shunt regulator, the first PTC device having a first terminal for coupling to the charger in series and a second terminal for coupling to the chargeable element in series; and
    a second PTC device coupled in series with the shunt regulator,
    wherein the first PTC device switches from a relatively low resistance to a relatively high resistance when heated to a first transition temperature, and
    wherein the second PTC device switches from a relatively low resistance to a relatively high resistance when heated to a second transition temperature higher than the first transition temperature.

37. In combination, a protection circuit and a battery, the battery having a positive terminal and a negative terminal, the protection circuit comprising:
    a transistor switch coupled in series with the battery, such that, when the transistor switch in ON, the battery will discharge through a load;
    a temperature-dependent resistor thermally coupled to the transistor switch, and having first and second terminals, the first terminal coupled to the positive battery terminal; and
    a fixed resistor having a first terminal coupled to the second terminal fo the temperature dependent resistor, and a seond terminal coupled to the negative battery terminal, the respective temperature dependent resistor and fixed resistor thereby coupled in series with each other and in parallel with the battery,
    wherein the transistor switch has an activation gate coupled in a divider configuration to the second terminal of the temperature dependent resistor and first terminal of the fixed resistor.

38. The combination of claim 37, the temperature dependent resistor switching from a relatively low first resistance to a relatively high second resistance at a certain transition temperature, with of the first resistance of the temperature dependent resistor and the resistance of the fixed resistor selected such that the voltage seen at the activation gate will keep the transistor switch ON, so long as the battery voltage is greater than a selected minimum voltage.

39. The combination of claim 38, wherein the transition temperature is selected such that, in an overvoltage condition in the battery, current flowing through the transistor switch will generate sufficient ohmic heat to heat the temperature dependent resistor to the transition temperature before causing failure of the transistor switch.

* * * * *

UNITED STATES PATENT AND TRADEMARK OFFICE
CERTIFICATE OF CORRECTION

PATENT NO. : 6,331,763 B1
APPLICATION NO. : 09/425519
DATED : December 18, 2001
INVENTOR(S) : Thomas et al.

It is certified that error appears in the above-identified patent and that said Letters Patent is hereby corrected as shown below:

<u>Title page,</u>
Item (63) References cited, U.S. Patent Documents:

Please insert --4,475,012   10/1984   Coulmance --

Please insert --4,698,655   10/1987   Schultz --

Please insert --5,146,384   9/1992   Markovic et al --

Please insert --5,379,176   1/1995   Bacon --

Please insert --5,477,124   12/1995   Tamai --

Please insert --5,504,411   4/1996   McCabeb et al. --

Please insert --5,672,952   9/1997   Szepesi --

UNITED STATES PATENT AND TRADEMARK OFFICE
CERTIFICATE OF CORRECTION

PATENT NO.       : 6,331,763 B1
APPLICATION NO.  : 09/425519
DATED            : December 18, 2001
INVENTOR(S)      : Thomas et al.

It is certified that error appears in the above-identified patent and that said Letters Patent is hereby corrected as shown below:

<u>Title page,</u>
Item (63) References cited, Foreign Patent Documents:

Please insert --0 319 020   EP--

Please insert --0 863 597 A1   EP--

Please insert --19829775A1   DE--

Please insert --29808365U1   DE--

Please insert --3831935A1   DE--

Please insert --01157234   JP--

Please insert --98/33257   WO--

Please insert --99/56374   WO--

Please insert --2349284   GB--

Signed and Sealed this

Twenty-ninth Day of August, 2006

JON W. DUDAS
*Director of the United States Patent and Trademark Office*